United States Patent
Eom et al.

(10) Patent No.: US 11,742,340 B2
(45) Date of Patent: Aug. 29, 2023

(54) SEMICONDUCTOR PACKAGE INCLUDING STACKED SEMICONDUCTOR CHIPS

(71) Applicant: SK hynix Inc., Icheon-si (KR)

(72) Inventors: Ju Il Eom, Icheon-si (KR); Seung Yeop Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 22 days.

(21) Appl. No.: 17/153,353

(22) Filed: Jan. 20, 2021

(65) Prior Publication Data

US 2022/0028847 A1     Jan. 27, 2022

(30) Foreign Application Priority Data

Jul. 27, 2020 (KR) .......................... 10-2020-0093000

(51) Int. Cl.
*H01L 25/18*     (2023.01)
*H01L 23/498*     (2006.01)
*H01L 23/00*     (2006.01)

(52) U.S. Cl.
CPC ........ *H01L 25/18* (2013.01); *H01L 23/49816* (2013.01); *H01L 23/49838* (2013.01); *H01L 24/05* (2013.01); *H01L 24/45* (2013.01)

(58) Field of Classification Search
CPC ............... H01L 25/18; H01L 23/49816; H01L 23/49838; H01L 24/05; H01L 24/45
See application file for complete search history.

(56) References Cited

U.S. PATENT DOCUMENTS

2017/0365558 A1\* 12/2017 Oh ....................... H01L 23/5383
2020/0272564 A1\* 8/2020 Keeth ..................... H01L 25/18
2021/0074641 A1\* 3/2021 Sung .................... H01L 23/3121

\* cited by examiner

*Primary Examiner* — Benjamin Tzu-Hung Liu
(74) *Attorney, Agent, or Firm* — William Park & Associates Ltd.

(57) ABSTRACT

A semiconductor package includes a substrate; a sub semiconductor package disposed over the substrate, the sub semiconductor package including a sub semiconductor chip with chip pads on its active surface that faces the substrate, a sub molding layer that surrounds side surfaces of the sub semiconductor chip, the sub molding layer with a surface that faces the substrate, and redistribution conductive layers that connect to the chip pads and extend under the surface of the sub molding layer, wherein the redistribution conductive layers include a signal redistribution conductive layer that extends toward an edge of the sub molding layer, the signal redistribution conductive layer with a signal redistribution pad on its end portion, and a power redistribution conductive layer that has a length that is shorter than a length of the signal redistribution conductive layer, the power redistribution conductive layer with a power redistribution pad on its end portion; a signal sub interconnector with an upper surface that is connected to the signal redistribution pad and a lower surface that is connected to the substrate; a power sub interconnector with an upper surface that is connected to the power redistribution pad and a lower surface that is connected to the substrate; and at least one main semiconductor chip formed over the sub semiconductor package and electrically connected to the substrate.

21 Claims, 15 Drawing Sheets

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2020-0093000 filed on Jul. 27, 2020, which is incorporated herein by reference in its entirety.

BACKGROUND

1. Technical Field

This patent document relates to a semiconductor package, and more particularly, to a semiconductor package in which a plurality of semiconductor chips are stacked in a vertical direction.

2. Related Art

Electronic products require high-volume data processing while their sizes are getting smaller. Accordingly, there is a growing need to increase the degree of integration of semiconductor devices used in such electronic products.

However, due to the limitations of semiconductor integration technology, it is difficult to satisfy a required function with only a single semiconductor chip, and thus a semiconductor package in which a plurality of semiconductor chips are embedded has been manufactured.

SUMMARY

In an embodiment, a semiconductor package may include: a substrate; a sub semiconductor package disposed over the substrate, the sub semiconductor package including a sub semiconductor chip with chip pads on its active surface that faces the substrate, a sub molding layer that surrounds side surfaces of the sub semiconductor chip, the sub molding layer with a surface that faces the substrate, and redistribution conductive layers that connect to the chip pads and extend under the surface of the sub molding layer, wherein the redistribution conductive layers include a signal redistribution conductive layer that extends toward an edge of the sub molding layer, the signal redistribution conductive layer with a signal redistribution pad on its end portion, and a power redistribution conductive layer that has a length that is shorter than a length of the signal redistribution conductive layer, the power redistribution conductive layer with a power redistribution pad on its end portion; a signal sub interconnector with an upper surface that is connected to the signal redistribution pad and a lower surface that is connected to the substrate; a power sub interconnector with an upper surface that is connected to the power redistribution pad and a lower surface that is connected to the substrate; and at least one main semiconductor chip formed over the sub semiconductor package and electrically connected to the substrate.

In another embodiment, a semiconductor package may include: a substrate; a sub semiconductor package disposed over the substrate, the sub semiconductor package including a sub semiconductor chip with chip pads on its active surface that faces the substrate, a sub molding layer that surrounds side surfaces of the sub semiconductor chip, the sub molding layer with a surface that faces the substrate, and a signal redistribution conductive layer and a power redistribution conductive layer that connect to the chip pads and extend under the surface of the sub molding layer to an edge of the sub molding layer; a signal sub interconnector with an upper surface that is connected to a signal redistribution pad, formed at an end portion of the signal redistribution conductive layer, and a lower surface that is connected to the substrate; a second power sub interconnector with an upper surface that is connected to a second is power redistribution pad, formed at an end portion of the power redistribution conductive layer, and a lower surface that is connected to the substrate; a first power sub interconnector with an upper surface that is connected to a first power redistribution pad, formed at a portion of the power redistribution conductive layer excluding the end portion of the power redistribution conductive layer, and a lower surface that is connected to the substrate; and at least one main semiconductor chip formed over the sub semiconductor package and electrically connected to the substrate.

In an embodiment, a semiconductor package may include: a substrate; a sub semiconductor package with a sub semiconductor chip disposed over the substrate, the sub semiconductor package further comprising: chip pads positioned on a surface of the sub semiconductor chip that faces the substrate; a sub molding layer surrounding side surfaces of the sub semiconductor chip in such a way that the sub molding layer has a surface that faces the substrate, wherein the surface of the sub molding layer is on a same level as the surface of the sub semiconductor chip that faces the substrate; and redistribution conductive layers that connect to the chip pads, wherein the redistribution conductive layers include a signal redistribution conductive layer and a power redistribution conductive layer, wherein the signal redistribution conductive layer has a signal redistribution pad on its end portion and the power redistribution conductive layer has a power redistribution pad on its end portion, and wherein a length of the power redistribution conductive layer is shorter than a length of the signal redistribution conductive layer; a signal sub interconnector with an upper surface that is connected to the signal redistribution pad and a lower surface that is connected to the substrate; a power sub interconnector with an upper surface that is connected to the power redistribution pad and a lower surface that is connected to the substrate; and at least one main semiconductor chip formed over the sub semiconductor package and electrically connected to the substrate.

DETAILED DESCRIPTION

Figure 1:
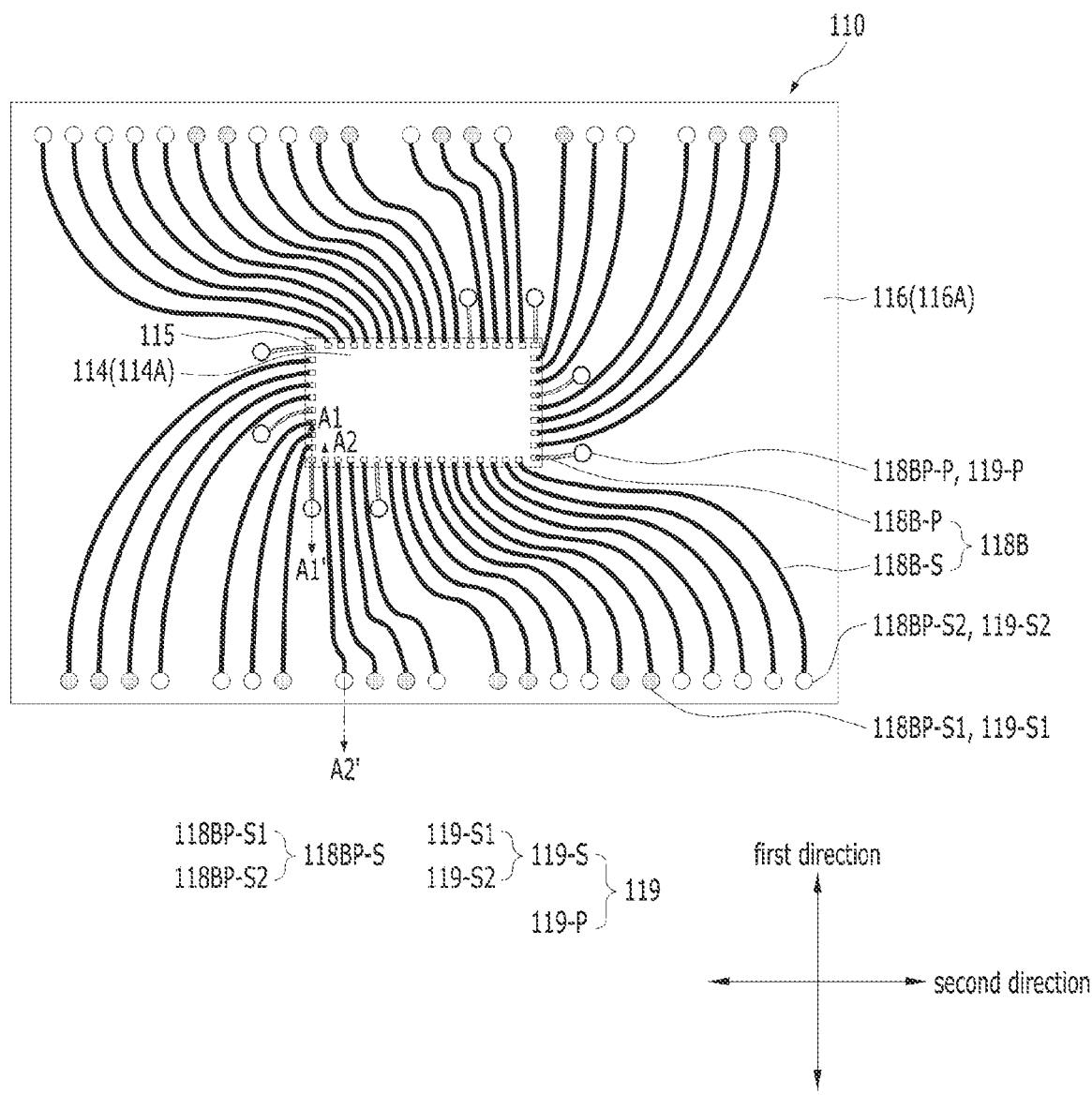
FIG. 1 is a plan view of a sub semiconductor package, according to an embodiment of the present disclosure when seen from the top.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a mufti-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, t can be directly connected or coupled to the other element or intervening elements may be present. In contrast, when an element is referred to as being "directly connected" or "directly coupled" to another element, there are no intervening elements present.

A semiconductor package according to an embodiment of the present disclosure may include a main semiconductor chip that performs a main function and a sub semiconductor chip that performs various functions required for the operation of the main semiconductor chip. The main semiconductor chip may include nonvolatile memory, such as NAND flash memory, and in this case, the sub semiconductor chip may include a memory controller. However, the present disclosure is not limited thereto, and each of the main semiconductor chip and the sub semiconductor chip may include various types of memory, a logic circuit, or the like. In the present embodiment, the sub semiconductor chip may be packaged and implemented as a sub semiconductor package, and the main semiconductor chip may be formed over this sub semiconductor package.

Hereinafter, prior to describing a semiconductor package of the present embodiment, a sub semiconductor package that is included in the semiconductor package will be described first.

Figure 2:
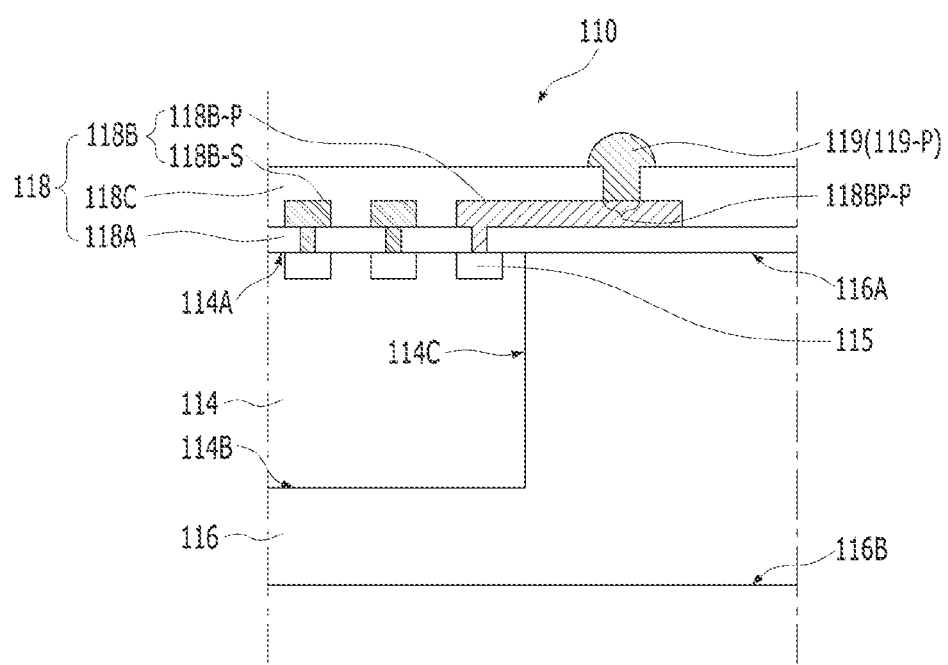
FIG. 2 is a cross-sectional view that is taken along a line A1-A1' of FIG. 1.
Figure 3:
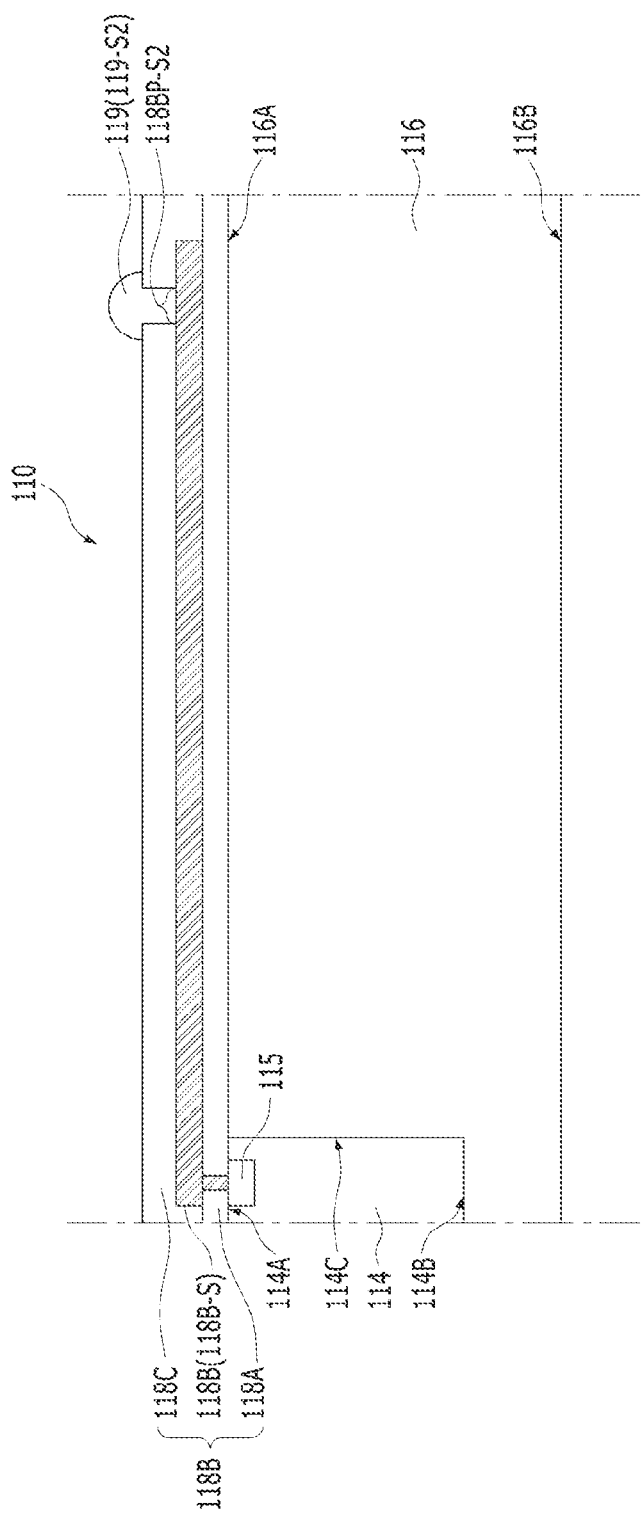
FIG. 3 is a cross-sectional view that is taken along a line A2-A2' of FIG. 1.

FIG. 1 is a plan view of a sub semiconductor package according to an embodiment of the present disclosure when seen from the top, FIG. 2 is a cross-sectional view that is taken along a line A1-A1' of FIG. 1. FIG. 3 is a cross-sectional view that is taken along a line A2-A2' of FIG. 1. FIGS. 2 and 3 show a state in which an active surface of a sub semiconductor chip faces upward.

Referring to FIGS. 1 to 3, a sub semiconductor package 110 of the present embodiment may include a sub semiconductor chip 114, a sub molding layer 116, a redistribution structure 118, and a sub interconnector 119.

The sub semiconductor chip 114 may have an active surface 114A on which a plurality of sub chip pads 115 are disposed, an inactive surface 114B that is positioned on the opposite side of the active surface 114A, and side surfaces 114C that connect the active surface 114A and the inactive surface 114B. In the present embodiment, the sub semiconductor chip 114 may have four side surfaces 114C by with a rectangular shape in a plan view. The four side surfaces 114C may be located at both sides in a first direction and at both sides in a second direction, the second direction being perpendicular to the first direction, respectively.

The plurality of sub chip pads 115 may be arranged in various forms while with an upper surface that is exposed from the active surface 114A. As an example, the sub chip pads 115 may be arranged along the entire edge of the sub semiconductor chip 114. That is, the sub chip pads 115 may be disposed at both side edges, first and second side edges, of the sub semiconductor chip 114 in the first direction and at both side edges, third and fourth side edges, of the sub semiconductor chip 114 in the second direction. In this case, a large number of sub chip pads 115 may be formed in the sub semiconductor chip 114 with a relatively small plane area, and thus, a large number of input/output signals may be transmitted through the sub semiconductor chip 114.

The sub semiconductor chip 114 may be positioned at a center region of the sub semiconductor package 110. This may be to reduce the variations in lengths of the plurality of signal redistribution conductive layers 118B-S that is to be described later.

The sub molding layer 116 may have one surface 116A with substantially the same level as the active surface 114A of the sub semiconductor chip 114 while surrounding the side surfaces 114C of the sub semiconductor chip 114.

Therefore, the sub molding layer 116 may expose the active surface 114A of the sub semiconductor chip 114 and the sub chip pads 115, In the present embodiment, the sub molding layer 116 may cover the inactive surface 114B of the sub semiconductor chip 114. However, the present disclosure is not limited thereto. In another embodiment, the sub molding layer 116 may have the other surface 116B that is positioned on the opposite side of the one surface 116A and has substantially the same level as the inactive surface 114B of the sub semiconductor chip 114. The sub molding layer 116 may include various molding materials, such as an epoxy molding compound (EMC).

The redistribution structure 118 may be formed over the active surface 114A of the sub semiconductor chip 114 and the one surface 116A of the sub molding layer 116. The redistribution structure 118 may include redistribution conductive layers 118B that extend onto the one surface 116A of the sub molding layer 116 and are electrically connected to the sub chip pads 115. That is, the sub semiconductor package 110 according to the present embodiment may be a fan-out package.

More specifically, the redistribution structure 118 may include a first redistribution insulating layer 118A, the redistribution conductive layers 118B, and a second redistribution insulating layer 118C.

The first redistribution insulating layer 118A may cover the active surface 114A of the sub semiconductor chip 114 and the one surface 116A of the sub molding layer 116. The first redistribution insulating layer 118A may have openings exposing the sub chip pads 115. The redistribution conductive layers 118B may be formed over the first redistribution insulating layer 118A. The redistribution conductive layers 118B may be electrically connected to the sub chip pads 115 through the openings of the first redistribution insulating layer 118A. The redistribution conductive layers 118B may include a signal redistribution conductive layer 118B-S and a power redistribution conductive layer 118B-P. The second redistribution insulating layer 118C may cover the first redistribution insulating layer 118A and the redistribution conductive layers 118B, The second redistribution insulating layer 118C may have openings exposing an end portion of the signal redistribution conductive layer 118B-S and an end portion of the power redistribution conductive layer 118B-P. The end portion of the signal redistribution conductive layer 118B-S, exposed by the opening of the second redistribution insulating layer 118C, will be referred to as a signal redistribution pad 118BP-S, and the end portion of the power redistribution conductive layer 118B-P, exposed by the opening of the second redistribution insulating layer 118C, will be referred to as a power redistribution pad 118BP-P. The signal redistribution conductive layer 118B-S, the signal redistribution pad 118BP-S, the power redistribution conductive layer 118B-P, and the power redistribution pad 118BP-P will be described in more detail below. The first redistribution insulating layer 118A and/or the second redistribution insulating layer 118C may include an insulating material, such as oxide, nitride, or oxynitride. Alternatively, the first redistribution insulating layer 118A and/or the second redistribution insulating layer 118C may include a resin material, such as epoxy, polyimide, polybenzoxazole (PBO), benzocyclobuten (BCB), silicone, or acrylate. The redistribution conductive layers 118B may include a metal material, such as copper, or a copper alloy.

The signal redistribution conductive layer 118B-S may be for signal transmission between the sub semiconductor chip 114 and other components. As an example, the signal redistribution conductive layer 118B-S may be for signal exchange between the sub semiconductor chip 114 and a main semiconductor chip that is to be described later, or between the sub semiconductor chip 114 and a substrate that is to be described later. Hereinafter, a signal exchanged between the sub semiconductor chip 114 and the main semiconductor chip will be referred to as an internal signal, and a signal exchanged between the sub semiconductor chip 114 and the substrate will be referred to as an external signal.

A plurality of signal redistribution conductive layers 118B-S may extend toward both side edges of the sub molding layer 116 in the first direction. As an example, the signal redistribution conductive layers 118B-S, which are connected to the sub chip pads 115 that are disposed at first and third side edges of the sub semiconductor chip 114 in the first and second directions, respectively, may extend to a first side edge of the sub molding layer 116 in the first direction. Also, the signal redistribution conductive layers 118B-S, which are connected to the sub chip pads 115 that are disposed at second and fourth side edges of the sub semiconductor chip 114 in the first and second directions, respectively, may extend to a second side edge of the sub molding layer 116 in the first direction. The signal redistribution conductive layers 118B-S, which extend from the both side edges of the sub semiconductor chip 114 in the second direction, may have curved shapes toward the both side edges of the sub molding layer 116 in the first direction. On the other hand, the signal redistribution conductive layers 118B-S, which extend from the both side edges of the sub semiconductor chip 114 in the first direction, might not need to be curved. However, the signal redistribution conductive layers 118B-S extending from the both side edges of the sub semiconductor chip 114 in the first direction may also have curved shapes, in order to have lengths that are similar to lengths of the signal redistribution conductive layers 118B-S extending from the both side edges of the sub semiconductor chip 114 in the second direction. As a result, the signal redistribution conductive layers 118B-S may have a spiral shape centering on the sub semiconductor chip 114. Through such a connection scheme, it may be possible to reduce variations in the lengths of the signal redistribution conductive layers 118B-S.

According to the arrangement of the signal redistribution conductive layers 118B-S, the signal redistribution pads 118BP-S may be arranged along the second direction, at each of the both side edges of the sub molding layer 116 in the first direction. For reference, the signal redistribution conductive layer 118B-S may have a line-shaped portion, having a relatively small width, extending from the sub chip pad 115. The signal redistribution conductive layer 118B-S may also have a plate-shaped end portion, having a relatively large width, positioned at an end of the line-shaped portion. The opening of the second redistribution insulating layer 118C may expose the plate-shaped end portion of the signal redistribution conductive layer 118B-S, and may have a planar area less than or equal to a planar area of the plate-shaped end portion while overlapping the plate-shaped end portion.

The power redistribution conductive layer 118B-P may be for supplying power from a substrate, to be described later, to the sub semiconductor chip 114. Various levels of power voltages or a ground voltage may be supplied to the sub semiconductor chip 114 through the power redistribution conductive layer 118B-P.

A plurality of power redistribution conductive layers 118B-P may be connected to the sub chip pads 115, and may extend onto the one surface 116A of the sub molding layer 116. The power redistribution conductive layer 118B-P may have a shorter length than the signal redistribution conductive layer 118B-S. That is, unlike the signal redistribution conductive layers 118B-S, the power redistribution conductive layers 118B-P might not extend to the edge of the sub molding layer 116. The power redistribution conductive layer 118B-P may be substantially parallel to a part of the adjacent signal redistribution conductive layer 118B-S. This may be to prevent an electrical short between the power redistribution conductive layer 118B-P and the signal redistribution conductive layer 118B-S.

According to the arrangement of the power redistribution conductive layers 118B-P, a plurality of power redistribution pads 118BP-P may be disposed to surround the sub semiconductor chip 114 at predetermined intervals. For reference, the power redistribution conductive layer 118B-P may have a line-shaped portion, having a relatively small width, extending from the sub chip pad 115, The power redistribution conductive layer 118B-P may also have a plate-shaped end portion, having a relatively large width, positioned at an end of the line-shaped portion. The opening of the second redistribution insulating layer 118C may expose the plate-shaped end portion of the power redistribution conductive layer 118B-P, and may have a planar area less than or equal to a planar area of the plate-shaped end portion while overlapping the plate-shaped end portion.

The sub interconnector 119 may include a signal sub interconnector 119-S, overlapping and connecting with the signal redistribution pad 118BP-S, and a power sub interconnector 119-P, overlapping and connecting with the power redistribution pad 118BP-P. Because the positions of the signal redistribution pad 118BP-S and the signal sub interconnector 119-S are substantially the same in a plan view and the positions of the power redistribution pad 118BP-P and the power sub interconnector 119-P are substantially the same in a plan view, the signal redistribution pad 118BP-S and the signal sub interconnector 119-S are shown together in the plan view of FIG. 1, and the power redistribution pad 118BP-P and the power sub interconnector 119-P are shown together in the plan view of FIG. 1. A plurality of signal sub interconnectors 119-S may be arranged along the second direction at both side edges of the sub molding layer 116 in the first direction, A plurality of power sub interconnectors 119-P may be arranged to surround the sub semiconductor chip 114 at predetermined intervals.

The sub interconnector 119 may be connected to the signal redistribution pad 118BP-S or the power redistribution pad 118BP-P through the opening of the second redistribution insulating layer 118C and may protrude above a surface of the second redistribution insulating layer 118C. The sub interconnector 119 may include a solder ball, a metal bump, or a combination thereof. However, the present embodiment is not limited thereto, and various forms of electrical interconnectors, which protrude above the surface of the second redistribution insulating layer 118C while being connected to the signal redistribution pad 118BP-S or the power redistribution pad 118BP-P, may be used as the sub interconnector 119.

Meanwhile, the signal redistribution pad 118BP-S and the signal sub interconnector 119-S may be classified into ones that exchange the internal signal, described above, and ones that exchange the external signal, described above. The signal redistribution pad 118BP-S and the signal sub interconnector 119-S that exchange the internal signal will be referred to as an internal signal redistribution pad 118BP-S1 and an internal signal sub interconnector 119-S1, respectively. Also, the signal redistribution pad 118BP-S and the signal sub interconnector 119-S that exchange the external signal will be referred to as an external signal redistribution pad 118BP-S2 and an external signal sub interconnector 119-S2, respectively.

A semiconductor package with the sub semiconductor package 110, described above, will be described with reference to FIGS. 4 to 7 below.

Figure 4:
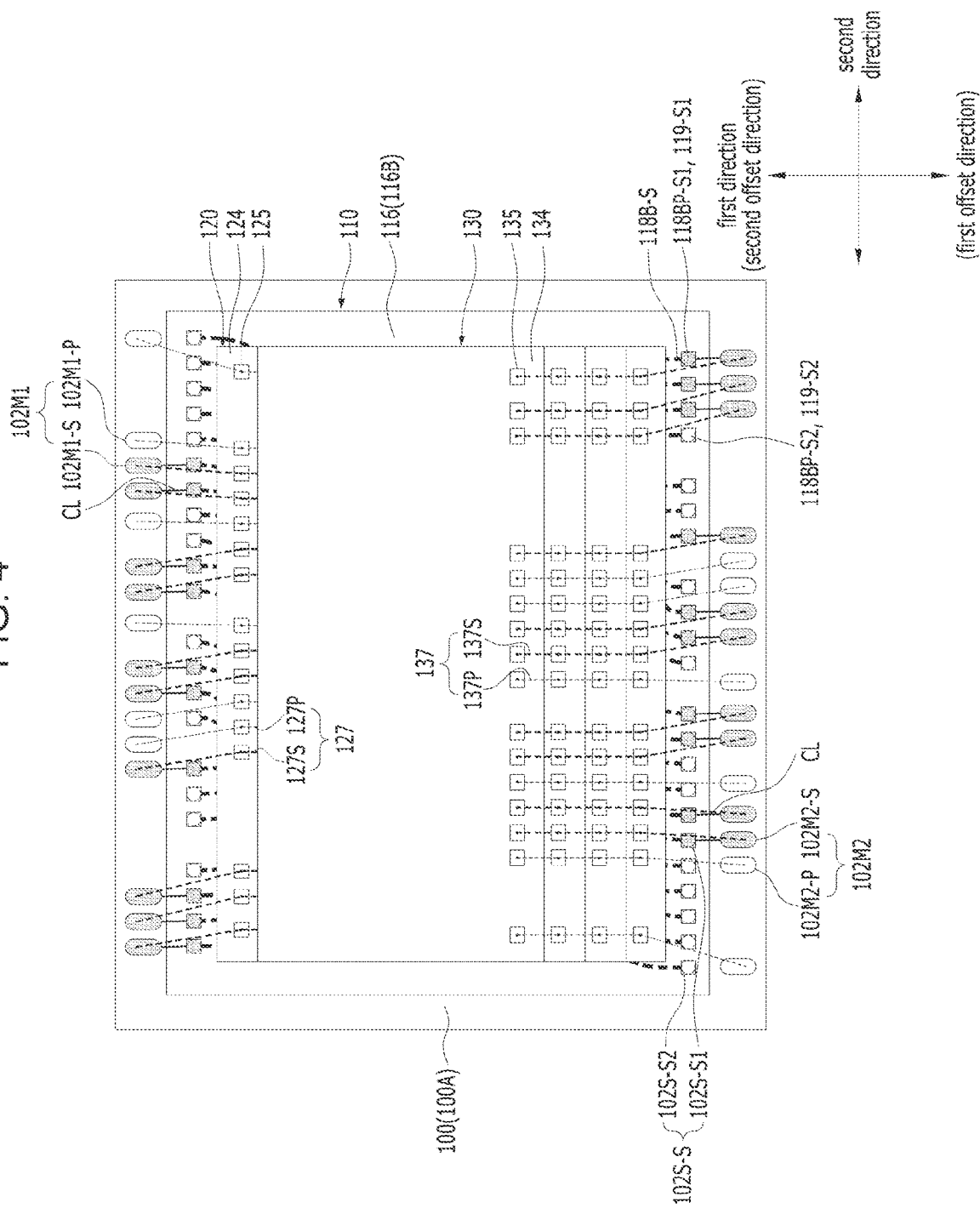
FIG. 4 is a plan view, illustrating a semiconductor package, according to an embodiment of the present disclosure when seen from the top.
Figure 5:
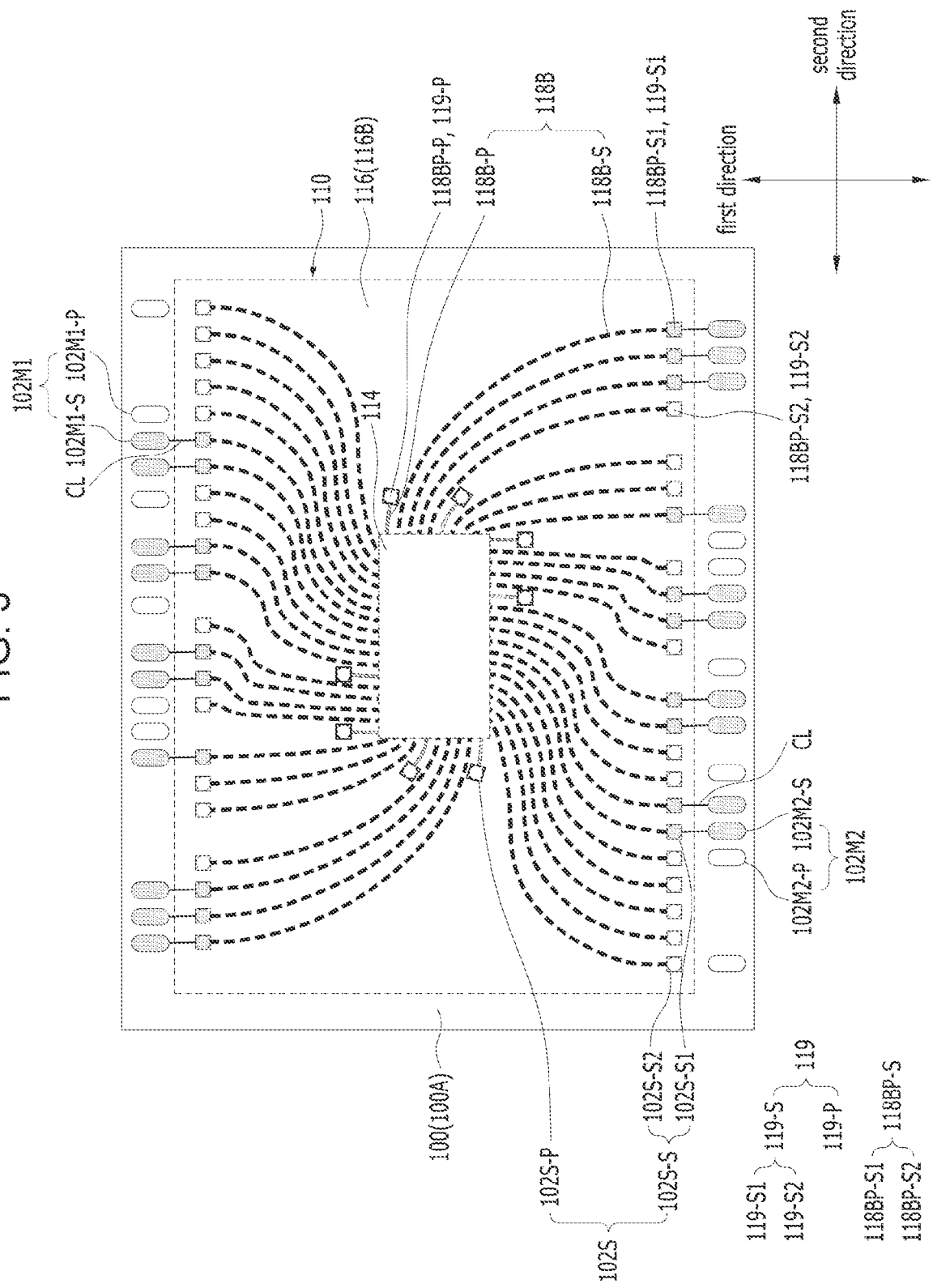
FIG. 5 is a plan view, illustrating an upper surface of a substrate of the semiconductor package of FIG. 4.
Figure 6:
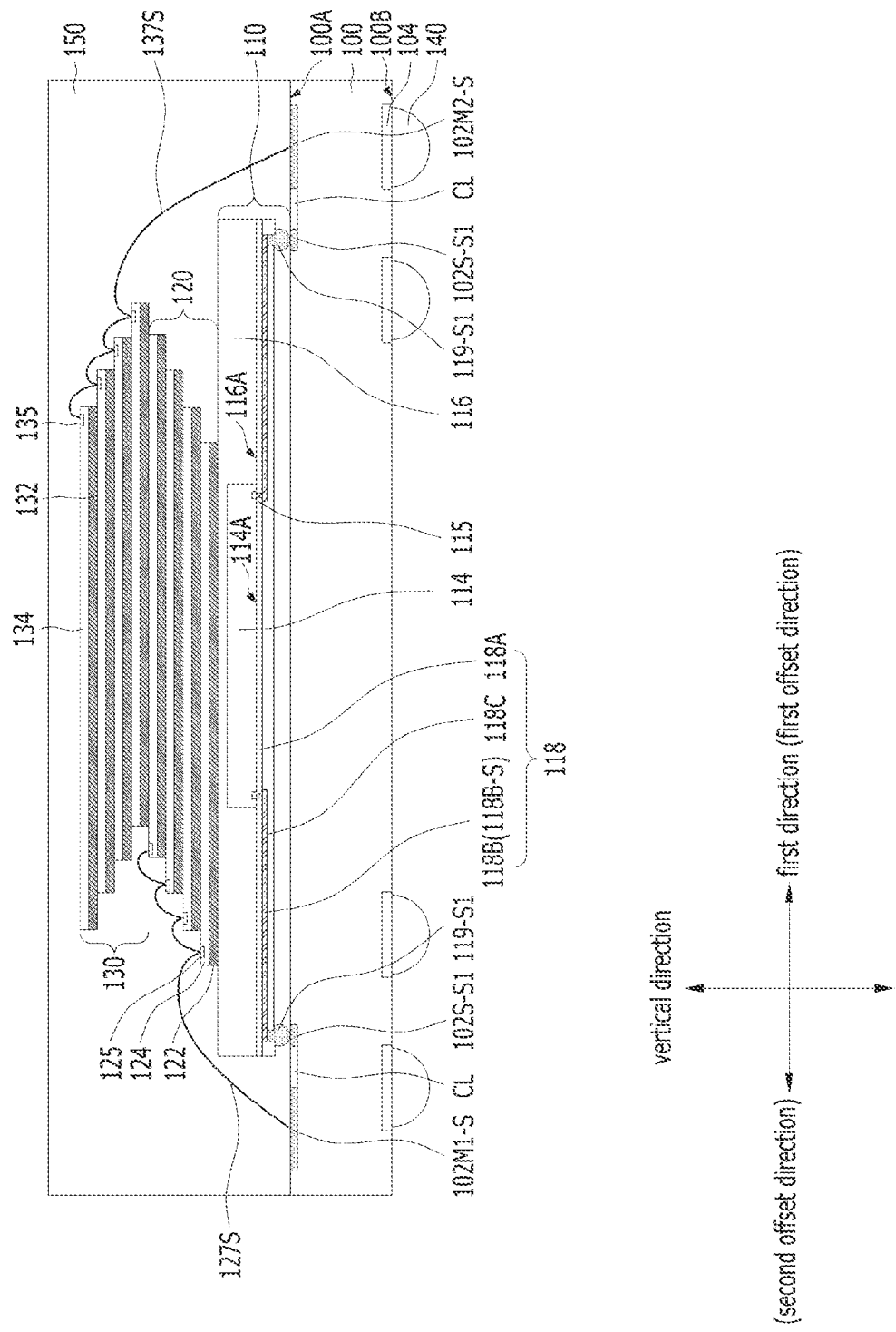
FIGS. 6 and 7 are cross-sectional views, illustrating the semiconductor package of FIG. 4.
Figure 7:
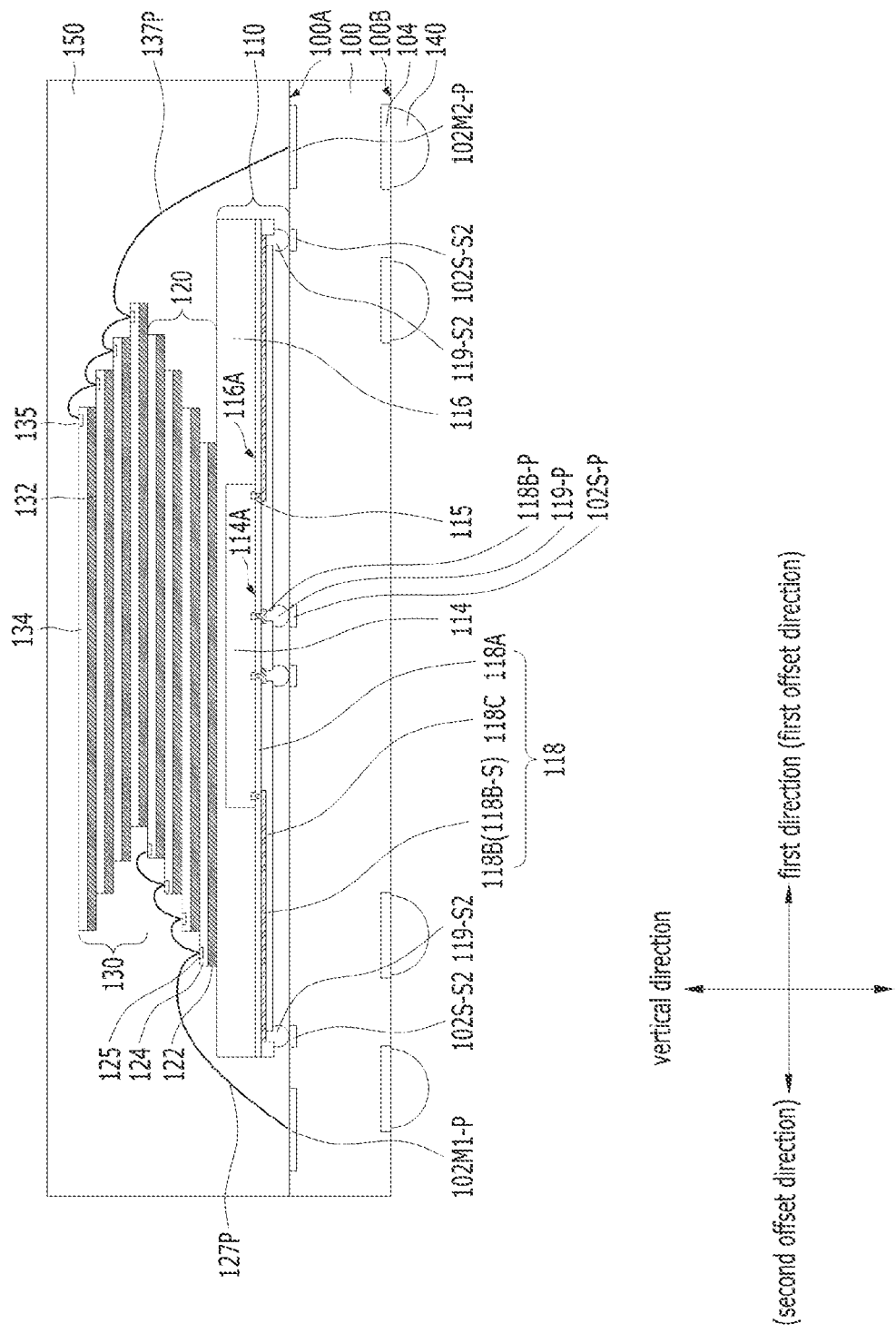

FIG. 4 is a plan view, illustrating a semiconductor package, according to an embodiment of the present disclosure, seen from the top. FIG. 5 is a plan view, illustrating an upper surface of a substrate of the semiconductor package of FIG. 4. FIGS. 6 and 7 are cross-sectional views, illustrating the semiconductor package of FIG. 4. In particular, FIG. 6 is a cross-sectional view, illustrating internal signal exchange between first and second main chip stacks and a sub semiconductor package in FIG. 4. FIG. 7 is a cross-sectional view, illustrating external signal exchange between the sub semiconductor package and the substrate, the power transfer between the first and second main chip stacks and the substrate, and the power transfer between the sub semiconductor package and the substrate in FIG. 4

Referring to FIGS. 4 to 7, a semiconductor package according to an embodiment of the present disclosure may include a substrate 100, a sub semiconductor package 110 that is disposed over the substrate 100, and first and second main chip stacks 120 and 130 that are disposed over the sub semiconductor package 110.

The substrate 100 may be a substrate for a semiconductor package, which has a circuit and/or wiring structure to transfer electrical signals. For example, the substrate 100 may include a printed circuit board (PCB).

The substrate 100 may have an upper surface 100A, a lower surface 100B that is on the opposite side of the upper surface 100A, and side surfaces that connect the upper surface 100A and the lower surface 100B.

The sub semiconductor package 110, the first main chip stack 120, and the second main chip stack 130 may be disposed over the upper surface 100A of the substrate 100. In particular, the sub semiconductor package 110 may be mounted over the substrate 100 such that the active surface 114A of the sub semiconductor chip 114 and the one surface 116A of the sub molding layer 116 face the upper surface 100A of the substrate 100. That is, the sub semiconductor package 110 may be mounted over the substrate 100 in a face-down form. Accordingly, in the plan view of FIG. 4, detailed components that are included in the sub semiconductor package 110 might not be visible except for the other surface 116B of the sub molding layer 116. However, for convenience of description, some components of the sub semiconductor package 110, which are not covered by the first and second main chip stacks 120 and 130, are illustrated by dotted lines in FIG. 4. In addition, for convenience of description, the detailed components of the sub semiconductor package 110 are also illustrated by dotted lines in FIG. 5. For reference, because the sub semiconductor package 110 is mounted over the substrate 100 in a face-down form, the left and right positions of the detailed components of the sub semiconductor package 110 of FIGS. 4 and 5 are inverted compared to FIG. 1. External connection terminals 140 that connect the semiconductor package of the present embodiment to an external component may be disposed over the lower surface 100B of the substrate 100. For reference, an upper surface and a lower surface, to be described below, are expressions to indicate relative positions of various surfaces of a component and do not indicate absolute positions. For example, in the case in which the semiconductor package is turned upside down unlike the illustration, a surface over which the sub semiconductor package 110 and the first and second main chip stacks 120 and 130 are disposed may be a lower surface of the substrate 100, and a surface over which the external connection terminals 140 are disposed may be an upper surface of the substrate 100.

A sub substrate pad 102S, a first main substrate pad 102M1, and a second main substrate pad 102M2 may be disposed on the upper surface 100A of the substrate 100. The sub substrate pad 102S may be electrically connected to the sub semiconductor package 110, the first main substrate pad 102M1 may be electrically connected to the first main chip stack 120, and the second main substrate pad 102M2 may be electrically connected to the second main chip stack 130. A lower surface substrate pad 104 for connection with the external connection terminal 140 may be disposed on the lower surface 100B of the substrate 100. For reference, substrate pads may mean electrically conductive elements or terminals that are exposed on the surfaces of the substrate 100 to electrically connect the substrate 100 with other components. These substrate pads may be connected to the circuit and/or wiring structure that is inside the substrate 100.

The sub substrate pad 102S may overlap and connect with the sub interconnector 119. When the sub interconnector 119 includes a metal bump, the sub substrate pad 102S may include a bump bonding finger.

The sub substrate pad 102S may include a power sub substrate pad 102S-P that is connected to the power sub interconnector 119-P, and a signal sub substrate pad 102S-S that is connected to the signal sub interconnector 119-S. Further, the signal sub substrate pad 102S-S may include an internal signal sub substrate pad 102S-S1 that is connected to the internal signal sub interconnector 119-S1, and an external signal sub substrate pad 102S-S2 that is connected to the external signal sub interconnector 119-S2, A plurality of power sub substrate pads 102S-P may overlap and connect with the power sub interconnectors 119-P, respectively, and thus, the power sub substrate pads 102S-P may be arranged to surround the sub semiconductor chip 114 on the upper surface 100A of the substrate 100. A plurality of signal sub substrate pads 102S-S may overlap and connect with the signal sub interconnectors 119-S, respectively, the signal sub substrate pads 102S-S may be arranged to overlap each of the both side edges of the sub molding layer 116 in the first direction, on the upper surface 100A of the substrate 100.

The first main substrate pad 102M1 may be connected to a first main interconnector 127 that is to be described later, and the second main substrate pad 102M2 may be connected to a second main interconnector 137 that is to be described later. When the first and second main interconnectors 127 and 137 are bonding wires, the is first and second main substrate pads 102M1 and 102M2 may include wire bonding fingers. A plurality of first main substrate pads 102M1 may be arranged along the second direction at a first side edge of the substrate 100 in the first direction, A plurality of second main substrate pads 102M2 may be arranged along the second direction at a second side edge of the substrate 100 in the first direction. The first main substrate pad 102M1 and the second main substrate pad 102M2 may be exposed without being covered by the sub semiconductor package 110. To this end, the sub semiconductor package 110 may have a width that is smaller than that of the upper surface 100A of the substrate 100 in the first direction and may be disposed relatively at the center of the substrate 100. Further, the first main substrate pad 102M1 and the second main substrate pad 102M2 may be exposed without being covered by the first and second main chip stacks 120 and 130.

The first main substrate pad 102M1 may include a first signal main substrate pad 102M1-S that exchanges the internal signal between the sub semiconductor package 110 and the first main chip stack 120, and a first power main substrate pad 102M1-P for supplying power to the first main chip stack 120. In this case, the first signal main substrate pad 102M1-S may be electrically connected to the internal signal sub substrate pad 102S-S1 that overlaps with the first side edge of the sub molding layer 116, by a connection line CL that is formed in the substrate 100. The connection line CL may connect the first signal main substrate pad 102M1-S to which the first main chip stack 120 is electrically connected, and the internal signal sub substrate pad 102S-S1 to which the sub semiconductor package 110 is electrically connected, to each other. Therefore, the electrical connection between the first main chip stack 120 and the sub semiconductor package 110 may be possible. The connection line CL may be positioned at the same level as the first signal main substrate pad 102M1-S and the internal signal sub substrate pad 102S-S1 in a cross-sectional view. Also, the connection line CL may have a linear shape so as to have the shortest distance between the first signal main substrate pad 102M1-S and the internal signal sub substrate pad 102S-S1 in a plan view. This may be to form an internal signal transmission path between the first signal main substrate pad 102M1-S and the internal signal sub substrate pad 102S-S1 with the shortest distance. However, the present disclosure is not limited thereto, and as long as the first signal main substrate pad 102M1-S and the internal signal sub substrate pad 102S-S1 are connected to each other in the substrate 100, the position and shape of the connection line CL may be modified in various ways.

The second main substrate pad 102M2 may include a second signal main substrate pad 102M2-5 that exchanges the internal signal between the sub semiconductor package 110 and the second main chip stack 130, and a second power main substrate pad 102M2-P for supplying power to the second main chip stack 130. In this case, the second signal main substrate pad 102M2-S may be electrically connected to the internal signal sub substrate pad 102S-S1, overlapping with the second side edge of the sub molding layer 116, by the connection line CL that is formed in the substrate 100. The connection line CL may connect the second signal main substrate pad 102M2-S to which the second main chip stack 130 is electrically connected to the internal signal sub substrate pad 102S-S1 to which the sub semiconductor package 110 is electrically connected, Therefore, the electrical connection between the second main chip stack 130 and the sub semiconductor package 110 may be possible. The connection line CL may be positioned at the same level as the second signal main substrate pad 102M2-S and the internal signal sub substrate pad 102S-S1 in a cross-sectional view. Also, the connection line CL may have a linear shape so as to have the shortest distance between the second signal main substrate pad 102M2-S and the internal signal sub substrate pad 102S-S1 in a plan view. This may be to form an internal signal transmission path between the second signal main substrate pad 102M2-S and the internal signal sub substrate pad 102S-S1 with the shortest distance. However, the present disclosure is not limited thereto, and as long as the second signal main substrate pad 102M2-S and the internal signal sub substrate pad 102S-S1 are connected to each other in the substrate 100, the position and shape of the connection line CL may be modified in various ways.

The lower surface substrate pad 104 may be connected to the external connection terminal 140. When the external connection terminal 140 includes a solder ball, the lower surface substrate pad 104 may include a ball land.

Because the detailed configuration of the sub semiconductor package 110 has already been described, detailed descriptions thereof be omitted. The sub semiconductor package 110 may be electrically connected to the substrate 100 through the sub interconnector 119. In particular, referring to FIGS. 5 and 7, the power sub interconnector 119-P may be connected to the power sub substrate pad 102S-P. Accordingly, an electrical path that passes through the sub semiconductor chip 114, the power redistribution conductive layer 118B-P, the power sub interconnector 119-P, and the power sub substrate pad 102S-P, that is, a power supply path, may be formed. In this case, because the power redistribution conductive layer 118B-P that is connected to the power sub interconnector 119-P has a relatively shorter length than that of the signal redistribution conductive layer 118B-S, the length of the power supply path may be reduced. Although not shown, the power sub substrate pad 102S-P may be electrically connected to the external connection terminal 140 through the circuit and/or wiring structure that is inside the substrate 100, thereby being connected to an external component (not shown) and being supplied with power from the external component. Also, referring to FIGS. 5 and 7, the external signal sub interconnector 119-S2 may be connected to the external signal sub substrate pad 102S-S2. Accordingly, an electrical path that passes through the sub semiconductor chip 114, the signal redistribution conductive layer 118B-S, the external signal sub interconnector 119-S2, and the external signal sub substrate pad 102S-S2, that is, an external signal transmission path, may be formed. Although not shown, the external signal sub substrate pad 102S-S2 may be electrically connected to the external connection terminal 140 through the circuit and/or wiring structure that is inside the substrate 100, thereby being connected to an external component (not shown) and exchanging a signal with the external component. Further, referring to FIGS. 5 and 6, the internal signal sub interconnector 119-S1 may be connected to the internal signal sub substrate pad 102S-S1. As will be described later, the internal signal sub substrate pad 102S-S1 may be connected to the first signal main substrate pad 102M1-S and the second signal main substrate pad 102M2-S through the connection line CL. Therefore, the electrical connection between each of the first and second main chip stacks 120 and 130 and the sub semiconductor chip 114 may be possible. This will be described together while describing the first and second main chip stacks 120 and 130. The power supply path that passes through the power redistribution conductive layer 118B-P, the power sub interconnector 119-P, and the power sub substrate pad 102S-P of the substrate 100 may be shorter than the signal transmission path that passes through the signal redistribution conductive layer 118B-S, the signal sub interconnector 119-S, and the signal sub substrate pad 102S-S of the substrate 100.

The first main chip stack 120 may include a plurality of first main semiconductor chips 124. The first main semiconductor chips 124 may be formed over the sub semiconductor package 110, and may be stacked in a vertical direction with respect to the upper surface 100A of the substrate 100. While the present embodiment illustrates a case in which the first main chip stack 120 includes four first main semiconductor chips 124, the present disclosure is not limited thereto, and the number of first main semiconductor chips 124 that are included in the first main chip stack 120 may be modified in various ways to one or more first main semiconductor chips 124.

The first main semiconductor chips 124 may be stacked with a predetermined offset in a direction toward the second side in the first direction, for example, in a direction toward the lower side in FIG. 4 and the right side in FIGS. 6 and 7. Therefore, the first main chip stack 120 that has a step shape when viewed in its entirety may be formed. The offset stacking direction of the first main semiconductor chips 124 will be referred to as a first offset direction, According to such offset stacking, a first side edge of an upper surface of each of the remaining first main semiconductor chips 124, except for the uppermost first main semiconductor chip 124, among the first main semiconductor chips 124, may be exposed without being covered by the first main semiconductor chip 124 that lies immediately thereon. For example, the upper side edge of the upper surface of each of the remaining first main semiconductor chips 124 in FIG. 4 and the left side edge of the upper surface of each of the remaining first main semiconductor chips 124 in FIGS. 6 and 7 may be exposed. A first side edge of an upper surface of the uppermost first main semiconductor chip 124 may be exposed without being covered by the lowermost second main semiconductor chip 134 of the second main chip stack 130 that will be described later. First chip pads 125 may be disposed on such exposed portions of the first main semiconductor chips 124. A plurality of first chip pads 125 may be arranged in a line along the second direction at the first side edge of the upper surface of each of the first main semiconductor chips 124. However, the present disclosure is not limited thereto, and the number and arrangement of the first chip pads 125 at the first side edge of the upper surface of each of the first main semiconductor chips 124 may be modified in various ways. For reference, because a part of the first main chip stack 120 that is hidden by the second main chip stack 130 is not illustrated in the plan view of FIG. 1, a remaining part of the first main chip stack 120, for example, the first side edge of the lowermost first main semiconductor chip 124, is illustrated.

Each of the first main semiconductor chips 124 may be attached to the sub semiconductor package 110 or the first main semiconductor chip 124 that lies immediately thereunder, by a first adhesive layer 122. The first adhesive layer 122 may be formed on the lower surface of each of the first main semiconductor chips 124 to have a shape overlapping with the lower surface.

The first main chip stack 120 or the first main semiconductor chips 124 may have a planar area that is smaller than the sub semiconductor package 110, and may have a planar area larger than the sub semiconductor chip 114. The first main chip stack 120 may be disposed to expose at least the first and second main substrate pads 102M1 and 102M2 that are disposed at the both side edges of the substrate 100 in the first direction.

The first main chip stack 120 may be connected to the substrate 100 and the sub semiconductor package 110 through first main interconnectors 127. In the present embodiment, the first main chip stack 120 may be electrically connected to the substrate 100 to receive the power that is required for the operations of the first main chip stack 120 from the substrate 100. Also, the first main chip stack 120 may be electrically connected to the sub semiconductor package 110 to exchange the internal signal with the sub semiconductor chip 114. An interconnector, among the first main interconnectors 127, which connects the first main chip stack 120 and the substrate 100, will be referred to as a first power main interconnector 127P. Also, an interconnector, among the first main interconnectors 127, which connects the first main chip stack 120 and the sub semiconductor package 110, will be referred to as a first signal main interconnector 127S.

In particular, referring to FIGS. 4 and 6, the first signal main interconnector 127S may connect the adjacent first chip pads 125 to each other in the vertical direction and may connect the first chip pad 125 of the lowermost first main semiconductor chip 124 to the first signal main substrate pad 102M1-2. Accordingly, the first main semiconductor chips 124 may be electrically connected to each other, and the first main chip stack 120 may be electrically connected to the sub semiconductor package 110 through the substrate 100. More specifically, an electrical path that passes through the first main chip stack 120, the first signal main interconnector 127S, the first signal main substrate pad 102M1-S, the connection line CL, the internal signal sub substrate pad 102S-S1, the internal signal sub interconnector 119-S1, the signal redistribution conductive layer 118B-S, and the sub semiconductor chip 114, that is, a signal transmission path, may be formed.

In addition, particularly, referring to FIGS. 4 and 7, the first main power interconnector 127P may connect adjacent first chip pads 125 to each other in the vertical direction and may connect the first chip pad 125 of the lowermost first main semiconductor chip 124 to the first power main substrate pad 102M1-P of the substrate 100.

Accordingly, the first main semiconductor chips 124 may be electrically connected to each other, and the first main chip stack 120 may be electrically connected to the substrate 100. More specifically, an electrical path that passes through the first main chip stack 120, the first power main interconnector 127P, and the first power main substrate pad 102M1-P, that is, a power supply path, may be formed.

The first main interconnector 127 may be a bonding wire. However, the present embodiment is not limited thereto, and various types of electrical interconnectors may be used as the first main interconnector 127.

The second main chip stack 130 may include a plurality of second main semiconductor chips 134. The second main semiconductor chips 134 may be formed over the first main chip stack 120 and may be stacked in the vertical direction. While the present embodiment illustrates a case in which the second main chip stack 130 includes four second main semiconductor chips 134, the present disclosure is not limited thereto, and the number of second main semiconductor chips 134 that are included in the second main chip stack 130 may be modified in various ways to one or more second main semiconductor chips 134. Also, while, in the present embodiment, the number of second main semiconductor chips 134 that are included in the second main chip stack 130 is the same as the number of first main semiconductor chips 124 that are included in the first main chip stack 120, it is to be noted that these numbers may be different from each other.

The second main semiconductor chips 134 may be stacked with a predetermined offset in a direction toward the first side in the first direction, for example, in a direction toward the upper side in is FIG. 4 and the left side in FIGS. 6 and 7. Therefore, the second main chip stack 130 that has a step shape when viewed in its entirety may be formed. The offset stacking direction of the second main semiconductor chips 134 will be referred to as a second offset direction. The second offset direction may be opposite to the first offset direction. According to such offset stacking, a second side edge of an upper surface of each of the remaining second main semiconductor chips 134, except the uppermost second main semiconductor chip 134, among the second main semiconductor chips 134, may be exposed without being covered by the second main semiconductor chip 134 that lies immediately thereon. For example, a lower side edge of the upper surface of each of the remaining second main semiconductor chips 134 in FIG. 4 and the right side edge of the upper surface of each of the remaining second main semiconductor chips 134 in FIGS. 6 and 7 may be exposed. The uppermost second main semiconductor chip 134 may be in a state in which its entire upper surface is exposed. Second chip pads 135 may be disposed on the exposed portions of the remaining second main semiconductor chips 134 except the uppermost second main semiconductor chip 134, and second chip pads 135 of the uppermost second main semiconductor chip 134 may also be disposed at the same positions as the second chip pads 135 of the remaining second main semiconductor chips 134. A plurality of second chip pads 135 may be arranged in a line along the second direction at the second is side edge of the upper surface of each of the second main semiconductor chips 134. However, the present disclosure is not limited thereto, and the number and arrangement of the second chip pads 135 at the second side edge of the upper surface of each of the second main semiconductor chips 134 may be modified in various ways.

In the case in which the second main semiconductor chips 134 are the same semiconductor chips as the first main semiconductor chips 124, each second main semiconductor chip 134 may correspond to a state in which each first main semiconductor chip 124 is rotated by 180 degrees about one axis extending in the vertical direction.

Each of the second main semiconductor chips 134 may be attached to the second main semiconductor chip 134 that lies immediately thereunder or the uppermost first main semiconductor chip 124 of the first main chip stack 120, by a second adhesive layer 132. The second adhesive layer 132 may be formed on the lower surface of each of the second main semiconductor chips 134 to have a shape that overlaps with the lower surface.

The second main chip stack 130 or the second main semiconductor chips 134 may have a planar area that is smaller than the sub semiconductor package 110, and may have a planar area larger than the sub semiconductor chip 114. The second main chip stack 130 may be disposed to expose at least the first and second main substrate pads 102M1 and 102M2 that are disposed at the both side edges of the substrate 100 in the first direction.

The second main chip stack 130 may be connected to the substrate 100 and the sub semiconductor package 110 through second main interconnectors 137. In the present embodiment, the second main chip stack 130 may be electrically connected to the substrate 100 to receive the power that is required for the operations of the second main chip stack 130 from the substrate 100. Also, the second main chip stack 130 may be electrically connected to the sub semiconductor package 110 to exchange the internal signal with the sub semiconductor chip 114. An interconnector among the second main interconnectors 137, which connects the second main chip stack 130 and the substrate 100, will be referred to as a second power main interconnector 137P. Also, an interconnector among the second main interconnectors 137, which connects the second main chip stack 130 and the sub semiconductor package 110, will be referred to as a second signal main interconnector 137S.

In particular, referring to FIGS. 4 and 6, the second signal main interconnector 137S may connect the adjacent second chip pads 135 to each other in the vertical direction and may connect the second chip pad 135 of the lowermost second main semiconductor chip 134 to the second signal main substrate pad 102M2-2. Accordingly, the second main semiconductor chips 134 may be electrically connected to each other, and the second main chip stack 130 may be electrically connected to the sub semiconductor package 110 through the substrate 100. More specifically, an electrical path that passes through the second main chip stack 130, the second signal main interconnector 137S, the second signal main substrate pad 102M2-S, the connection line CL, the internal signal sub substrate pad 102S-S1, the internal signal sub interconnector 119-S1, the signal redistribution conductive layer 118B-S, and the sub semiconductor chip 114, that is, a signal transmission path, may be formed.

In addition, particularly, referring to FIGS. 4 and 7, the second power main interconnector 137P may connect adjacent second chip pads 135 to each other in the vertical direction and may connect the second chip pad 135 of the lowermost second main semiconductor chip 134 to the second power main substrate pad 102M2-P of the substrate 100, Accordingly, the second main semiconductor chips 134 may be electrically connected to each other, and the second main chip stack 130 may be electrically connected to the substrate 100. More specifically, an electrical path that passes through the second main chip stack 130, the second power main interconnector 137P, and the second power main substrate pad 102M2-P, that is, a power supply path, may be formed.

The second main interconnector 137 may be a bonding wire. However, the present embodiment is not limited thereto, and various types of electrical interconnectors may be used as the second main interconnector 137.

For reference, in the plan views of FIGS. 4 and 5, the first main interconnector 127 and the second main interconnector 137 are illustrated by different dotted lines for convenience of description. However, it is to be noted that, as a matter of course, such dotted lines do not reflect the actual shapes of the first and second main interconnectors 127 and 137.

The sub semiconductor package 110, the first main chip stack 120, and the second main chip stack 130 may be covered by a molding layer 150 that is formed over the substrate 100. The molding layer 150 may include various molding materials, such as an EMC.

The external connection terminals 140, described above, may include solder balls. However, the present disclosure is not limited thereto, and various conductive terminals, such as bumps may be used as the external connection terminals 140.

In the semiconductor package of the present embodiment, the first main chip stack 120 may be recognized as a single semiconductor chip group while being connected to the substrate 100 and the sub semiconductor package 110 through the first main interconnectors 127. Also, the second main chip stack 130 may be recognized as another single semiconductor chip group different from the first main chip stack 120 while being connected to the substrate 100 and the sub semiconductor package 110 through the second main interconnectors 137. The sub semiconductor chip 114 may be connected to the substrate 100 through the redistribution structure 118 and the sub interconnector 119.

According to the semiconductor package, described above, the following advantages may be obtained.

First, as the sub chip pads 115 are disposed along the entire edges of the sub semiconductor chip 114, a relatively large number of sub chip pads 115 may be disposed as compared to the size of the sub semiconductor chip 114. In addition, by redistributing the sub chip pads 115 by using a fan-out technology, the disposition of the sub chip pads 115 may be facilitated.

Furthermore, because some of the sub chip pads 115 are redistributed to the internal signal redistribution pads 118BP-S1 by using the fan-out technology, and the internal signal redistribution pads 118BP-S1 are connected to the first and second signal main substrate pads 102M1-S and 102M2-S through the internal signal sub interconnector 119-S1, the internal signal sub substrate pad 102S-S1, and the connection line CL that is inside the substrate 100, a signal transmission distance between the sub semiconductor chip 114 and the first and second main chip stacks 120 and 130 may be reduced.

Furthermore, because the sub semiconductor package 110 that is larger than the first and second main chip stacks 120 and 130 is disposed under the first and second main chip stacks 120 and 130 by using the fan-out technology, the first and second main chip stacks 120 and 130 may be stably formed. In a structure in which the first and second main chip stacks 120 and 130 are formed over the sub semiconductor chip 114, if the sub semiconductor chip 114 is smaller than the first and second main semiconductor chips 124 and 134, a problem may be caused in that the first and second main chip stacks 120 and 130 are inclined. By substantially increasing the area of the sub semiconductor chip 114 with the fan-out technology, such a problem might not be caused.

Furthermore, by adjusting the shapes and/or arrangements of the signal redistribution conductive layers 118B-S to cause the signal redistribution conductive layers 118B-S to have similar lengths, the operation characteristics of the semiconductor package may be secured. For example, when a first channel that is connected from the first main chip stack 120 to the sub semiconductor package 110 and a second channel that is connected from the second main chip stack 130 to the sub semiconductor package 110 exist, a path of the first channel and a path of the second channel may have similar lengths. Therefore, it may be possible to maximally prevent the transfer rates of signals from becoming different from channel to channel.

Furthermore, because the length of the power redistribution conductive layer 118B-P is shorter than the length of the signal redistribution conductive layer 118B-S, and the power redistribution conductive layer 118B-P and the substrate 100 are connected through is the power sub interconnector 119, it may be possible to easily supply power to the sub semiconductor chip 114. In this case, the length of the power supply path from the substrate 100 to the sub semiconductor chip 114 may be shortened, and thus, the impedance of the power supply path may decrease. This will be further described with reference to FIGS. 8A and 8B.

Figure 8A:
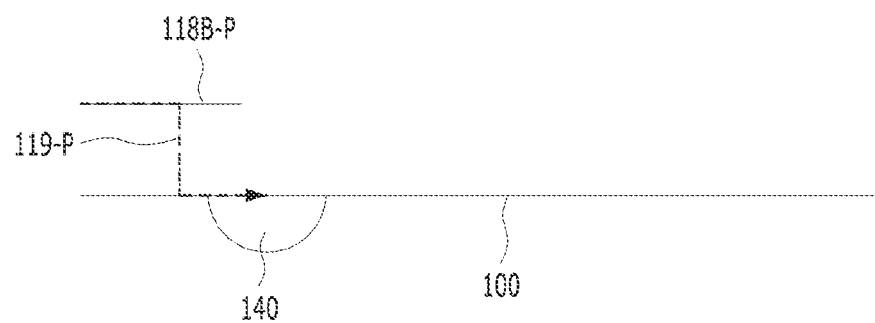
FIG. 8A is a view that explains an example of an effect of a semiconductor package according to an embodiment of the present disclosure.
Figure 8B:
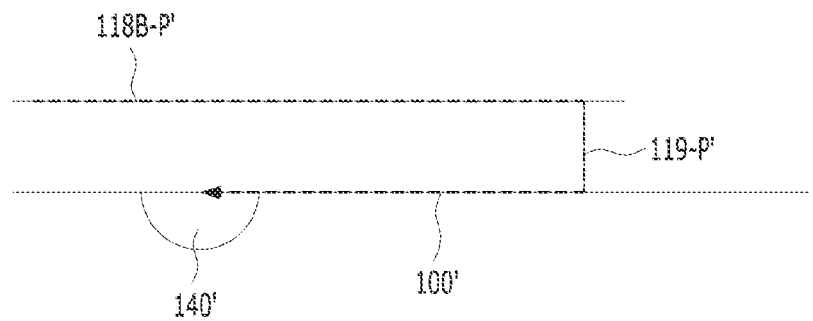
FIG. 8B is a view that explains an effect of a semiconductor package according to a comparative example.

FIG. 8A is a view that explains an example of an effect of a semiconductor package according to an embodiment of the present disclosure, and FIG. 8B is a view that explains an effect of a semiconductor package according to a comparative example. FIG. 8B illustrates a case in which a power redistribution conductive layer extends to an edge of a sub molding layer that is similar to a signal redistribution conductive layer, and an end portion of the power redistribution conductive layer is connected to a substrate through a bonding wire, unlike the present embodiment.

Referring to FIG. 8A, a relatively short current path (see dotted arrow), passing through the power redistribution conductive layer 118B-P that has a short length, the power sub interconnector 119-P that is disposed under and connected to the power redistribution conductive layer 118B-P, the substrate 100, and the external connection terminal 140 for supplying power, may be formed.

On the other hand, referring to FIG. 8B, a relatively long current path (see dotted arrow), passing through a power redistribution conductive layer 118B-P', that has a long length, a power sub interconnector 119-P' that is disposed under and connected to the power redistribution conductive layer 118B-P', a substrate 100', and an external connection terminal 140' for supplying power, may be formed.

In other words, in the comparative example of FIG. 8B, regardless of the location of the external connection terminal 140' for supplying power to the substrate 100', a power supply path that passes through the power redistribution conductive layer 118B-P' with a long length to extend to an edge of a sub molding layer may be formed, and thus, a relatively long power supply path may be inevitable compared to the embodiment of FIG. 8A.

As a result, according to the present embodiment as shown in FIG. 8A, a short current path may be formed, and thus, the impedance of the power supply path may be reduced. Therefore, supplying power may be facilitated.

Meanwhile, in the above-described embodiment, all of the redistribution conductive layers 118B extend outward from the edge of the sub semiconductor chip 114. However, because the power redistribution conductive layer 118B-P among the redistribution conductive layers 118B has a relatively short length, it may extend inward from the edge of the sub semiconductor chip 114. This will be exemplarily described with reference to FIG. 9 below.

Figure 9:
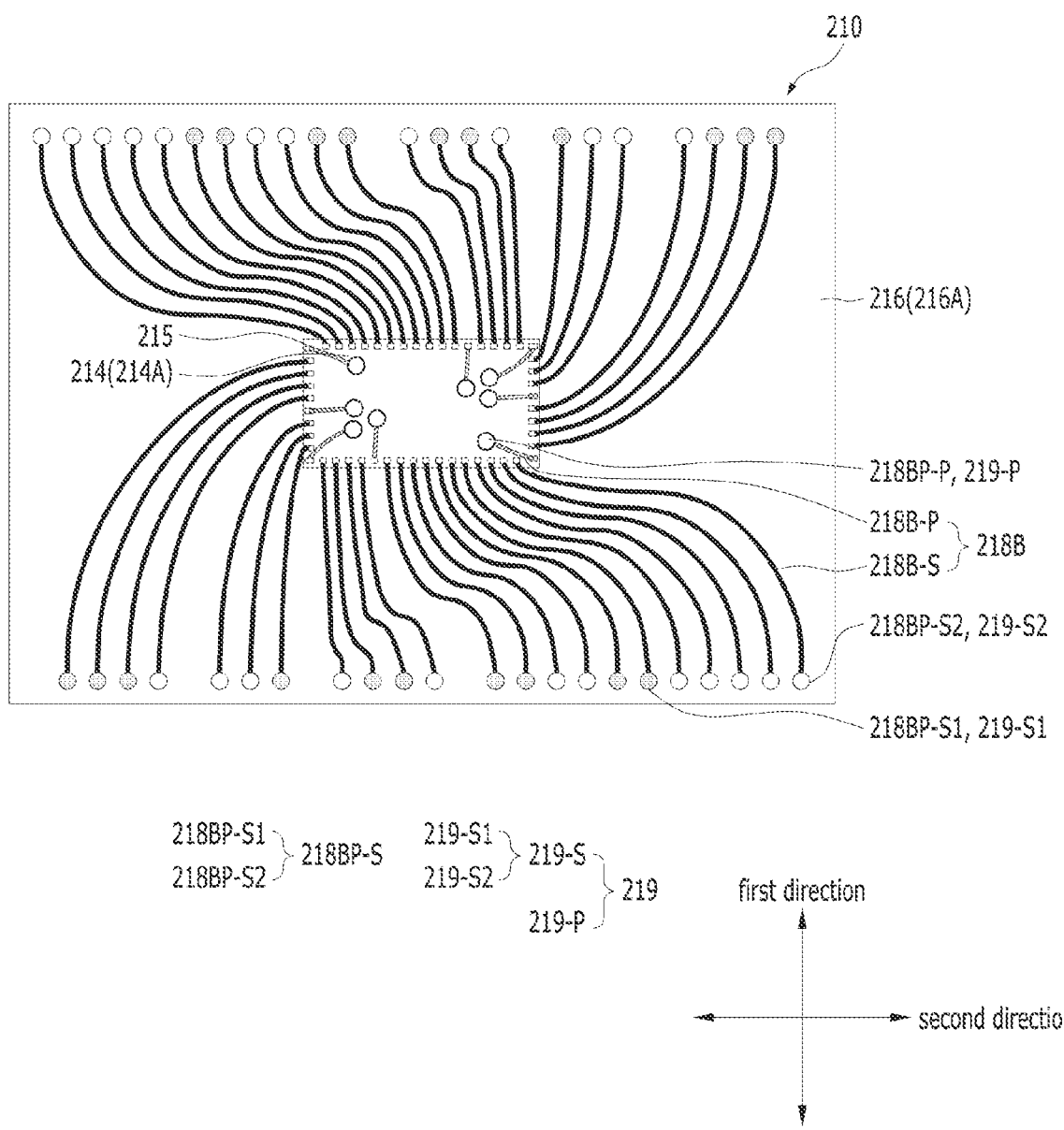
FIG. 9 is a plan view, illustrating a sub semiconductor package, according to another embodiment of the present disclosure.

FIG. 9 is a plan view, illustrating a sub semiconductor is package, according to another embodiment of the present disclosure. FIG. 9 is illustrated so that an active surface of a sub semiconductor chip is shown. For parts that are substantially the same as those of the above-described embodiment, detailed descriptions thereof will be omitted.

Referring to FIG. 9, a sub semiconductor package 210 of the present embodiment may include a sub semiconductor chip 214, a sub molding layer 216, a redistribution conductive layer 218B, and a sub interconnector 219.

A plurality of sub chip pads 215 may be disposed on an active surface 214A of the sub semiconductor chip 214.

The sub molding layer 216 may surround side surfaces of the sub semiconductor chip 214, and may have one surface 216A with substantially the same level as the active surface 214A of the sub semiconductor chip 214. Accordingly, the active surface 214A and the sub chip pads 215 may be exposed.

The redistribution conductive layer 218B may include a signal redistribution conductive layer 218B-S and a power redistribution conductive layer 218B-P.

The signal redistribution conductive layer 218B-S may extend outward from the edge of the sub semiconductor chip 214 while being connected to the sub chip pad 215. A plurality of signal redistribution conductive layers 218B-S may extend to both side edges of the sub molding layer 216 in the first direction so that a plurality of signal redistribution pads 218BP-S may extend along the second direction at the both side edges of the sub molding layer 216 in the first direction. The signal redistribution pad 218BP-S may include an internal signal redistribution pad 218BP-S1 and an external signal redistribution pad 218BP-S2.

On the other hand, the power redistribution conductive layer 218B-P may extend inward from the edge of the sub semiconductor chip 214 while being connected to the sub chip pad 215. Because the power redistribution conductive layer 218B-P has a short length, a plurality of power redistribution conductive layers 218B-P may overlap the sub semiconductor chip 214 and may be alternately disposed so as to not be shorted by each other. Although not shown, because a first redistribution insulating layer is interposed between the power redistribution conductive layer 218B-P and the sub semiconductor chip 214, the power redistribution conductive layer 218B-P and the sub semiconductor chip 214 may be separated and insulated from each other, except for the connection through the sub chip pad 215.

According to the arrangement of the power redistribution conductive layers 218B-P as described above, the power redistribution pads 218BP-P may be arranged to be spaced apart from each other in a region that overlaps the sub semiconductor chip 214.

A signal sub interconnector 219-S may be connected to the signal redistribution pad 218BP-S. In particular, an internal signal sub interconnector 219-S1 may be connected to the internal signal redistribution pad 218BP-S1, and an external signal sub interconnector 219-S2 may be connected to the external signal redistribution pad 218BP-S2. A power sub interconnector 219-P may be connected to the power redistribution pad 218BP-P. That is, the power sub interconnector 219-P may also overlap the sub semiconductor chip 214.

In the case of the present embodiment, all the effects of the above-described embodiment may be secured. Further, an electrical short between the signal redistribution conductive layer 218B-S and the power redistribution conductive layer 218B-P may be prevented.

Meanwhile, in the above-described embodiments, a case in which the power redistribution conductive layer 118B-P and 218B-P is shorter than the signal redistribution conductive layer 118B-S and 218B-S has been described. However, the present disclosure is not limited thereto, and a power redistribution conductive layer may have a length the same as or similar to a length of a signal redistribution conductive layer. In this case, by using a power sub interconnector that is connected to a point of the power redistribution conductive layer, a power supply path to a sub semiconductor chip may be shortened. This will be exemplarily described with reference to FIGS. 10 to 14.

Figure 10:
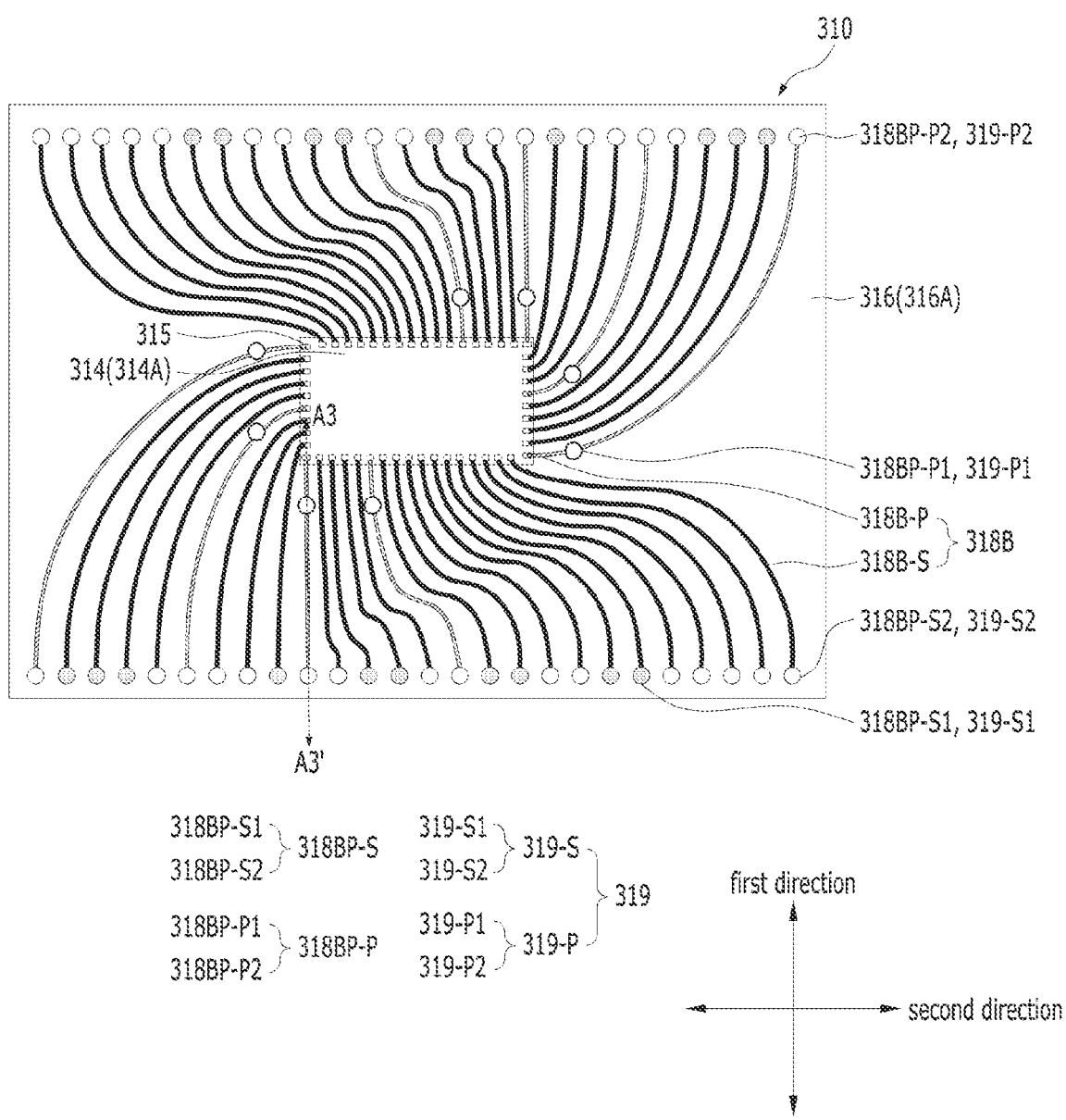
FIG. 10 is a plan view, illustrating a sub semiconductor package, according to another embodiment of the present disclosure when seen from the top.
Figure 11:
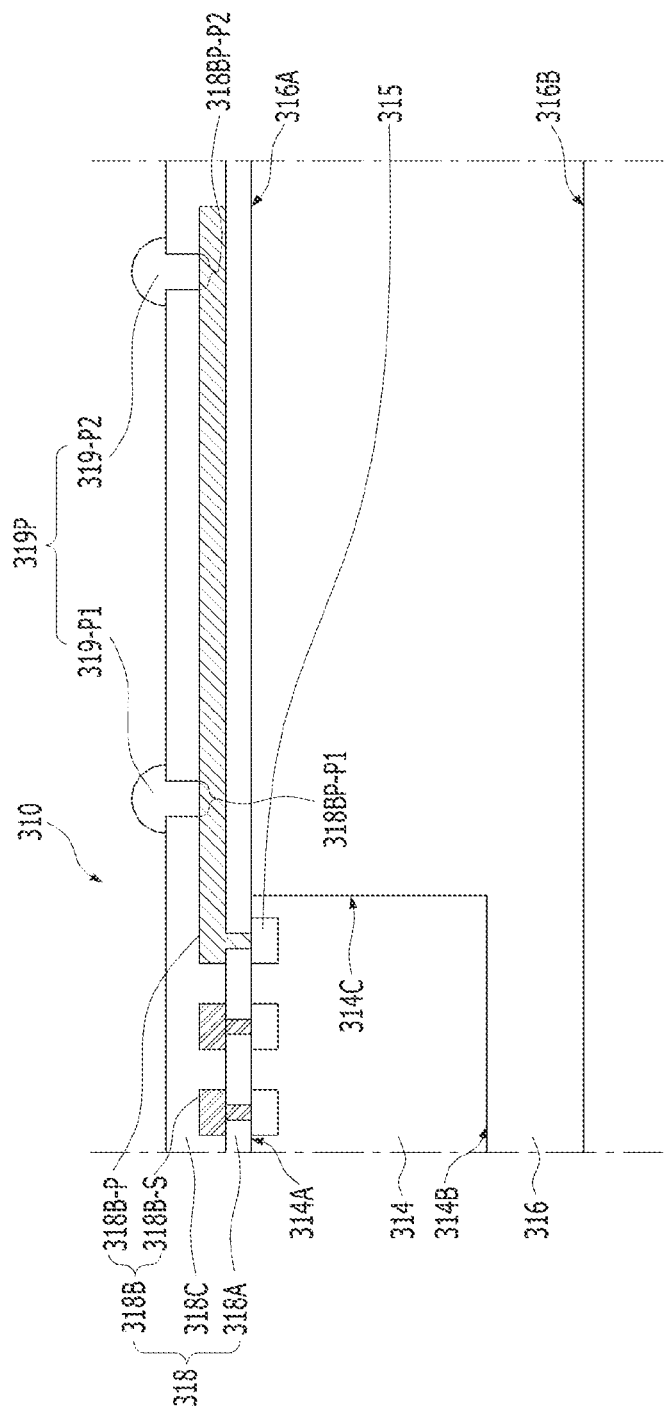
FIG. 11 is a cross-sectional view that is taken along a line A3-A3' of FIG. 10.
Figure 12:
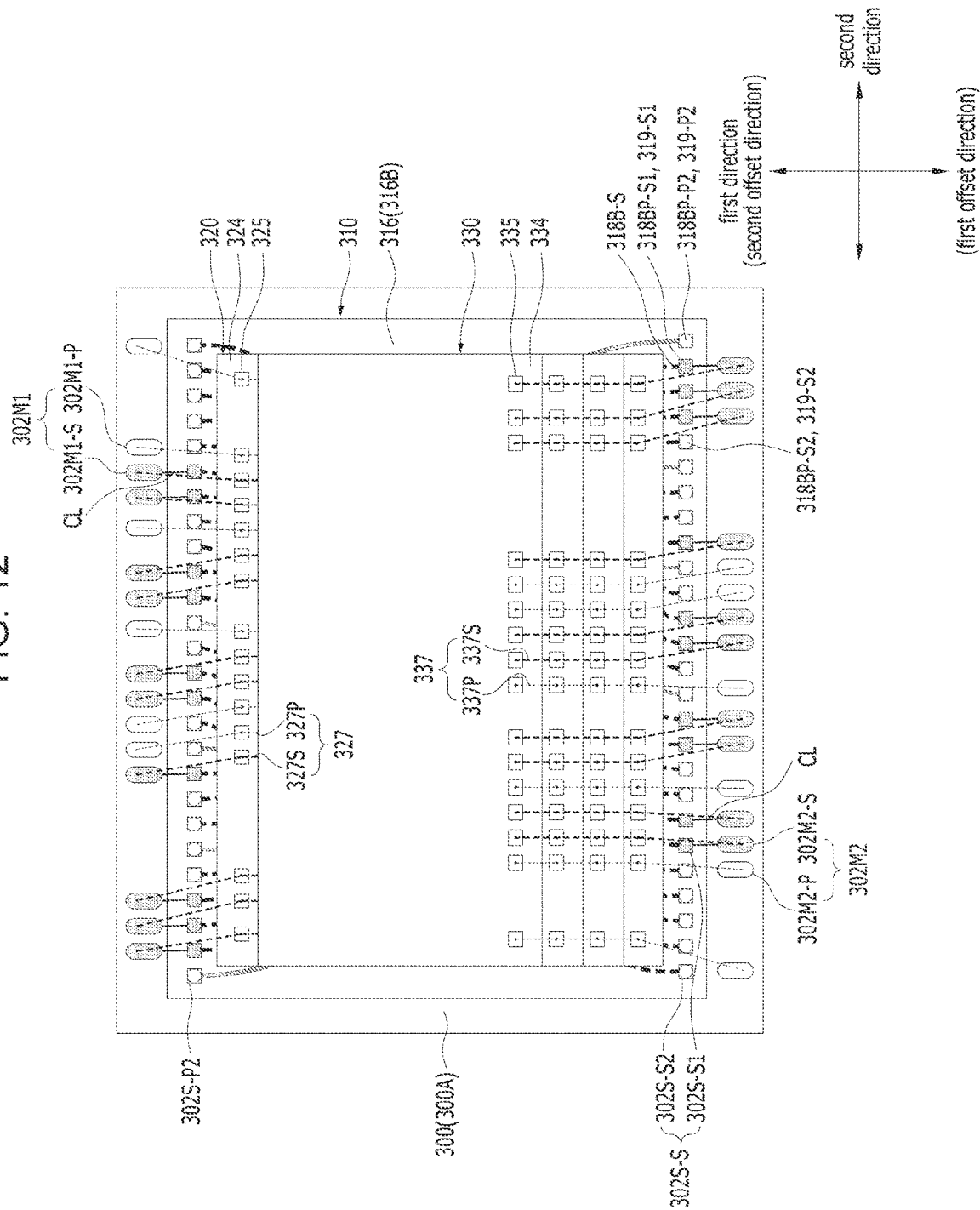
FIG. 12 is a plan view, illustrating a semiconductor package, according to another embodiment of the present disclosure when seen from the top.
Figure 13:
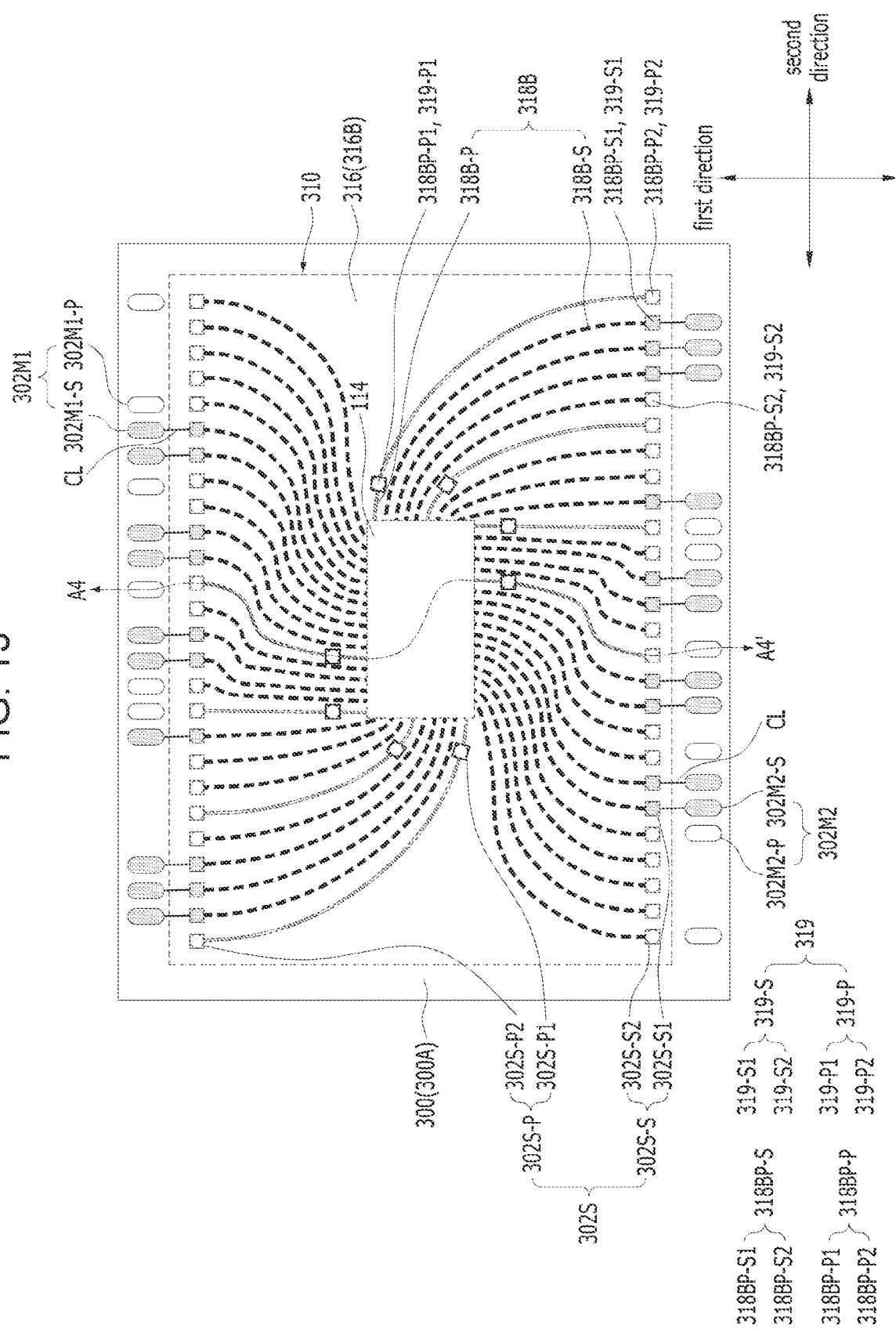
FIG. 13 is a plan view, illustrating an upper surface of a substrate of the semiconductor package of FIG. 12.
Figure 14:
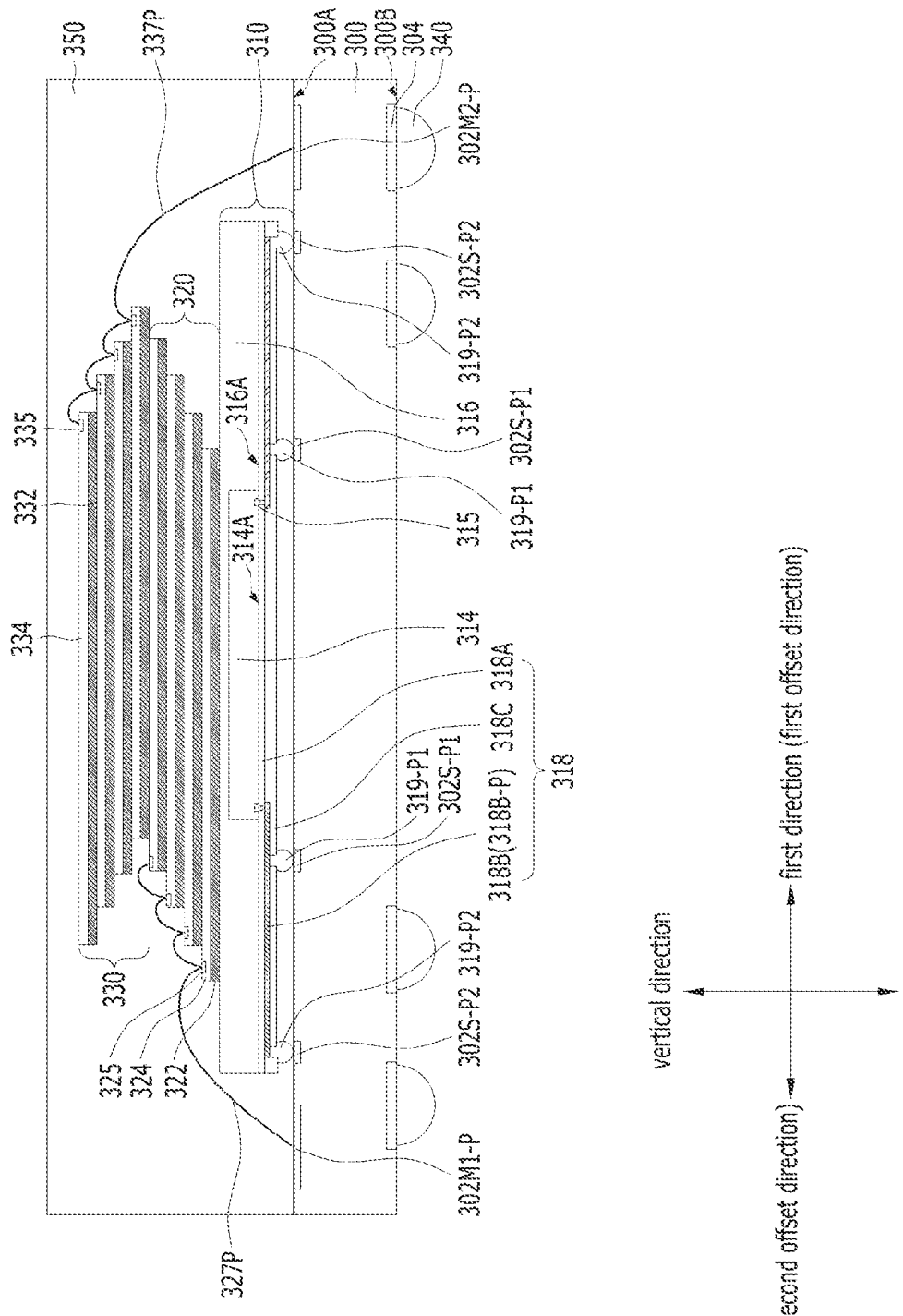
FIG. 14 is a cross-sectional view, illustrating the semiconductor package of FIG. 12.

FIG. 10 is a plan view, illustrating a sub semiconductor package, according to another embodiment of the present disclosure, seen from the top. FIG. 11 is a cross-sectional view that is taken along a line A3-A3' of FIG. 10. FIGS. 10 and 11 show a state in which an active surface of a sub semiconductor chip faces upward. FIG. 12 is a plan view, illustrating a semiconductor package according to another embodiment of the present disclosure, seen from the top, FIG. 13 is a plan view, illustrating an upper surface of a substrate of the semiconductor package of FIG. 12. FIG. 14 is a cross-sectional view, illustrating the semiconductor package of FIG. 12. In particular, a sub semiconductor package of FIG. 14 shows a cross-section along a line A4-A4' of FIG. 13, and the remaining portion of FIG. 14 are used to describe the power transfer between first and second main chip stacks and the substrate. Detailed descriptions of parts that are substantially the same as those of the above-described embodiments will be omitted.

First, referring to FIGS. 10 and 11, a sub semiconductor package 310 of the present embodiment may include a sub semiconductor chip 314, a sub molding layer 316, a redistribution structure 318, and a sub interconnector 319.

The sub semiconductor chip 314 may have an active surface 314A on which a plurality of sub chip pads 315 are disposed, an inactive surface 314B that is positioned on the opposite side of the active surface 314A, and side surfaces 314C that connect the active surface 314A and the inactive surface 314B. The plurality of sub chip pads 315 may be arranged along the entire edge of the sub semiconductor chip 314.

The sub molding layer 316 may have one surface 316A with substantially the same level as the active surface 314A of the sub semiconductor chip 314 while surrounding the side surfaces 314C of the sub semiconductor chip 314. Therefore, the sub molding layer 316 may expose the active surface 314A of the sub semiconductor chip 314 and the sub chip pads 315. The other surface 316B of the sub molding layer 316 may be the opposite side of the one surface 316A.

The redistribution structure 318 may be formed over the active surface 314A of the sub semiconductor chip 314 and the one surface 316A of the sub molding layer 316. The redistribution structure 318 may include a first redistribution insulating layer 318A, redistribution conductive layers 318B, and a second redistribution insulating layer 318C. The redistribution conductive layers 318 may extend onto the one surface 316A of the sub molding layer 316 while electrically connected to the sub chip pads 315.

The redistribution conductive layers 318B may include a signal redistribution conductive layer 318B-S and a power redistribution conductive layer 318B-P. In the present embodiment, all of the redistribution conductive layers 318B may extend toward both side edges of the sub molding layer 316 in the first direction, regardless of the signal redistribution conductive layer 318B-S and the power redistribution conductive layer 318B-P. As an example, the signal redistribution conductive layer 318B-S and the power is redistribution conductive layer 318B-P, which are connected to the sub chip pads 315 that are disposed at first and third side edges of the sub semiconductor chip 314 in the first and second directions, respectively, may extend toward a first side edge of the sub molding layer 316 in the first direction. In addition, the signal redistribution conductive layer 318B-S and the power redistribution conductive layer 318B-P, which are connected to the sub chip pads 315 that are disposed at second and fourth side edges of the sub semiconductor chip 314 in the first and second directions, respectively, may extend toward a second side edge of the sub molding layer 316 in the first direction. As a result, the redistribution conductive layers 318B may have a spiral shape centering on the sub semiconductor chip 314. Through this connection method, variations in the lengths of the redistribution conductive layers 318B may be reduced.

According to the arrangement of the signal redistribution conductive layer 318B-S and the power redistribution conductive layer 318B-P, as above, end portions of the signal redistribution conductive layer 318B-S and the power redistribution conductive layer 318B-P may be arranged along the second direction at each of the both side edges of the sub molding layer 316 in the first direction. The end portion of the signal redistribution conductive layer 318B-S may be exposed by an opening of the second redistribution insulating layer 318C to form a signal redistribution pad 318BP-S. The signal redistribution pad 318BP-S may include an internal signal redistribution pad 318BP-S1 and an external signal redistribution pad 318BP-S2. On the other hand, the end portion of the power redistribution conductive layer 318B-P may be exposed by the opening of the second redistribution insulating layer 318C, and a predetermined portion of the power redistribution conductive layer 319B-P, which is positioned between the sub semiconductor chip 314 and the end portion, may be exposed by the opening of the second redistribution insulating layer 318C. The end portion of the power redistribution conductive layer 318B-P exposed by the second redistribution insulating layer 318C will be referred to as a second power redistribution pad 318BP-P2, and the predetermined portion of the power redistribution conductive layer 318B-P exposed by the second redistribution insulating layer 318C will be referred to as a first power redistribution pad 318BP-P1. That is, the first power redistribution pad 318BP-P1 may be disposed closer to the sub semiconductor chip 314 than the second power redistribution pad 318BP-P2. The first and second power redistribution pads 318BP-P1 and 318BP-P2 will be referred to as a power redistribution pad 318BP-P.

The sub interconnector 319 may include a signal sub interconnector 319-S that overlaps and connects with the signal redistribution pad 318BP-S, and a power sub interconnector 319-P that overlaps and connects with the power redistribution pad 318BP-P. The signal sub interconnector 319-S may include an internal signal sub interconnector 319-S1 that overlaps and connects with the internal signal redistribution pad 318BP-S1, and an external signal sub interconnector 319-S2 that overlaps and connects with the external signal redistribution pad 318BP-S2, The power sub interconnector 319-P may include a first power sub interconnector 319-P1 that overlaps and connects with the first power redistribution pad 318BP-P1, and a second power sub interconnector 319-P2 that overlaps and connects with the second power redistribution pad 318BP-P2.

Next, a semiconductor package with the sub semiconductor package 310 of FIGS. 10 and 11 will be described with reference to FIGS. 12 to 14.

Referring to FIGS. 12 to 14, a semiconductor package, according to another embodiment of the present disclosure, may include a substrate 300, a sub semiconductor package 310 that is disposed over the substrate 300, and a first main chip stack 320 and a second main chip stack 330 that are disposed over the sub semiconductor package 310.

The substrate 300 may have an upper surface 300A, a lower surface 300B that is on the opposite side of the upper surface 300A, and side surfaces that connect the upper surface 300A and the lower surface 300B.

The sub semiconductor package 310, the first main chip stack 320, and the second main chip stack 330 may be disposed over the upper surface 300A of the substrate 300. In particular, the sub semiconductor package 310 may be mounted over the substrate 100 such that the active surface 314A of the sub semiconductor chip 314 and the one surface 316A of the sub molding layer 316 face the upper surface 300A of the substrate 300. That is, the sub semiconductor package 310 may be mounted over the substrate 300 in a face-down form. For convenience of description, some components of the sub semiconductor package 310, which are not covered by the first and second main chip stacks 320 and 330, are illustrated by dotted lines in FIG. 12. In addition, for convenience of description, the detailed components of the sub semiconductor package 310 are also illustrated by dotted lines in FIG. 13. For reference, because the sub semiconductor package 310 is mounted over the substrate 300 in a face-down form, left and right positions of the detailed components of the sub semiconductor package 310 of FIGS. 12 and 13 are inverted compared to FIG. 10. External connection terminals 340 that connect the semiconductor package of the present embodiment to an external component may be disposed over the lower surface 300B of the substrate 300.

A sub substrate pad 302S, a first main substrate pad 302M1, and a second main substrate pad 302M2 may be disposed on the upper surface 300A of the substrate 300. The sub substrate pad 302S may be electrically connected to the sub semiconductor package 310, the first main substrate pad 302M1 may be electrically connected to the first main chip stack 320, and the second main substrate pad 302M2 may be electrically connected to the second main chip stack 330. A lower surface substrate pad 304 for connection with the external connection terminal 340 may be disposed on the lower surface 300B of the substrate 300.

The sub substrate pad 302S may overlap and connect with the sub interconnector 319. The sub substrate pad 302S may include a power sub substrate pad 302S-P that is connected to the power sub interconnector 319-P, and a signal sub substrate pad 302S-S that is connected to the signal sub interconnector 319-S. The power sub substrate pad 302S-P may include a first power sub substrate pad 302S-P1 that is connected to the first power sub interconnector 319-P1, and a second power sub substrate pad 302S-P2 that is connected to the second power sub interconnector 319-P2. The signal sub substrate pad 302S-S may include an internal signal sub substrate pad 302S-S1 that is connected to the internal signal sub interconnector 319-S1, and an external signal sub substrate pad 302S-S2 that is connected to the external signal sub interconnector 319-S2, A plurality of first power sub substrate pads 302S-P1 may be arranged to surround the sub semiconductor chip 314, on the upper surface 300A of the substrate 300. A plurality of signal sub substrate pads 302S-S and a plurality of second power sub substrate pads 302S-P2 may be arranged to overlap each of the both side edges of the sub molding layer 316 in the first direction, on the upper surface 300A of the substrate 300.

The first main substrate pad 302M1 may be connected to a first main interconnector 327 that is to be described later, and the second main substrate pad 302M2 may be connected to a second main interconnector 337 that is to be described later. A plurality of first main substrate pads 302M1 may be arranged along the second direction at a first side edge of the substrate 300 in the first direction. A plurality of second main substrate pads 302M2 may be arranged along the second direction at a second side edge of the substrate 300 in the first direction. The first main substrate pad 302M1 and the second main substrate pad 302M2 may be exposed without being covered by the sub semiconductor package 310, Further, the first main substrate pad 302M1 and the second main substrate pad 302M2 may be exposed without being covered by the first and second main chip stacks 320 and 330.

The first main substrate pad 302M1 may include a first signal main substrate pad 302M1-S that exchanges an internal signal between the sub semiconductor package 310 and the first main chip stack 320, and a first power main substrate pad 302M1-P that supplies power to the first main chip stack 320. In this case, the first signal main substrate pad 302M1-S may be electrically connected to the internal signal sub substrate pad 302S-S1 by a connection line CL that is formed in the substrate 300.

The second main substrate pad 302M2 may include a second signal main substrate pad 302M2-S that exchanges an internal signal between the sub semiconductor package 310 and the second main chip stack 330, and a second power main substrate pad 302M2-P that supplies power to the second main chip stack 330. In this case, the second signal main substrate pad 302M2-S may be electrically connected to the internal signal sub substrate pad 302S-S1 by the connection line CL formed in the substrate 300.

Because the detailed configuration of the sub semiconductor package 310 has already been described, detailed descriptions thereof will be omitted. The sub semiconductor package 310 may be electrically connected to the substrate 300 through the sub interconnector 319.

In particular, the first power sub interconnector 319-P1 may be connected to the first power sub substrate pad 302S-P1, and the second power sub interconnector 319-P2 may be connected to the second power sub substrate pad 302S-P2. Accordingly, an electrical path that passes through the sub semiconductor chip 314, the power redistribution conductive layer 318B-P, the first and second power sub interconnectors 319-P1 and 319-P2, and the first and second power sub substrate pads 302S-P1 and 302S-P2, that is, a power supply path, may be formed. In this case, the first power sub interconnector 319-P1 may enable the formation of a short power supply path. Furthermore, the first and second power sub interconnectors 319-P1 and 319-P2 may enable the formation of multiple power supply paths, is Although not shown, the first and second power sub substrate pads 302S-P1 and 302S-P2 may be electrically connected to the external connection terminal 340 through a circuit and/or wiring structure that is inside the substrate 300, thereby being connected to an external component (not shown) and being supplied with power from the external component.

Also, the external signal sub interconnector 319-S2 may be connected to the external signal sub substrate pad 302S-S2, Accordingly, an electrical path that passes through the sub semiconductor chip 314, the signal redistribution conductive layer 318B-S, the external signal sub interconnector 319-S2, and the external signal sub substrate pad 302S-S2, that is, an external signal transmission path, may be formed. Although not shown, the external signal sub substrate pad 302S-S2 may be electrically connected to the external connection terminal 340 through the circuit and/or wiring structure that is inside the substrate 300, thereby being connected to an external component (not shown) and exchanging a signal with the external component.

Further, the internal signal sub interconnector 319-S1 may be connected to the internal signal sub substrate pad 302S-S1. The internal signal sub substrate pad 302S-S1 may be connected to the first signal main substrate pad 302M1-S and the second signal main substrate pad 302M2-S through the connection line CL. Therefore, the electrical connection between each of the first and second main chip stacks 320 and 330 and the sub semiconductor chip 314 may be possible. The structure of the first main chip stack 320, the connection relationship between the substrate 300 and the first main chip stack 320, and the connection relationship between the sub semiconductor package 310 and the first main chip stack 320 may be substantially the same as in the above-described embodiments. In addition, the structure of the second main chip stack 330, the connection relationship between the substrate 300 and the second main chip stack 330, and the connection relationship between the sub semiconductor package 310 and the second main chip stack 330 may be substantially the same as in the above-described embodiments, Unexplained reference numerals 324, 322, 325, 327, 327S, and 327P may represent a first main semiconductor chip, a first adhesive layer, a first chip pad, a first main interconnector, a first signal main interconnector, and a first power main interconnector, respectively. In addition, unexplained reference numerals 334, 332, 335, 337, 337S, and 337P may represent a second main semiconductor chip, a second adhesive layer, a second chip pad, a second main interconnector, a second signal main interconnector, and a second power main interconnector, respectively.

The sub semiconductor package 310, the first main chip stack 320, and the second main chip stack 330 may be covered by a molding layer 350 that is formed over the substrate 300.

In the case of the present embodiment, all the effects of the above-described embodiments may be secured.

In addition, it may be possible to form current paths that pass through the first and second power sub interconnectors 319-P1 and 319-P2 from one power redistribution conductive layer 318B-P, That is, multiple current paths as well as a short current path may be formed. As a result, the impedance and inductance of the power supply path may be reduced, and thus, the power supply between the sub semiconductor package 310 and the substrate 300 may be facilitated.

Further, the power redistribution conductive layer 318B-P that is disposed between the two signal redistribution conductive layers 318B-S may suppress the interference between the two signal redistribution conductive layers 318B-S.

According to the above embodiments of the present disclosure, it may be possible to implement a high-volume and multifunctional semiconductor package by forming a main chip stack including one or more main semiconductor chips over a sub semiconductor package, and to facilitate to supply power to the sub semiconductor package.

Figure 15:
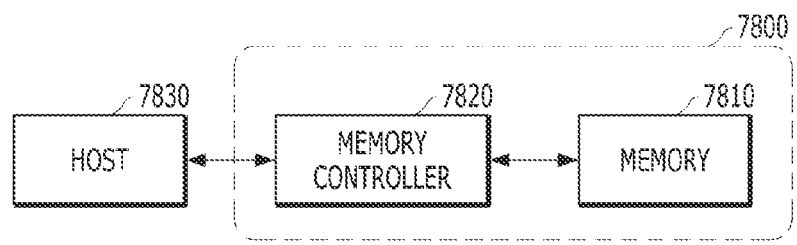
FIG. 15 shows a block diagram illustrating an electronic system employing a memory card including a semiconductor package, according to an embodiment.

FIG. 15 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 16:
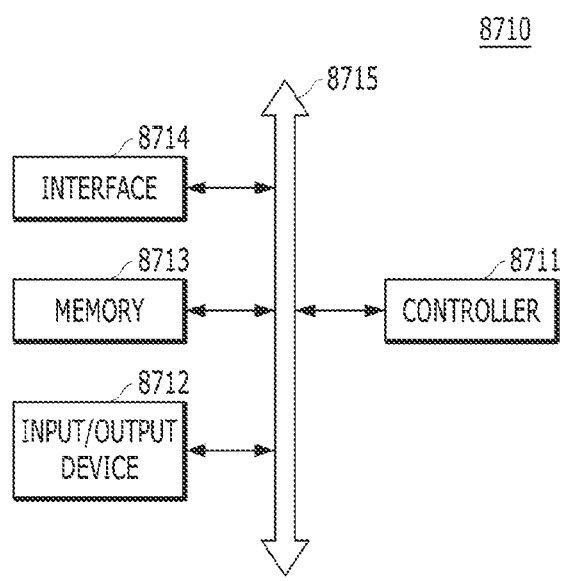
FIG. 16 shows a block diagram illustrating another electronic system including a semiconductor package, according to an embodiment.

FIG. 16 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
   a substrate;
   a sub semiconductor package disposed over the substrate, the sub semiconductor package including:
   a sub semiconductor chip having chip pads on its active surface that faces the substrate,
   a sub molding layer that surrounds side surfaces of the sub semiconductor chip, the sub molding layer having a surface that faces the substrate, and
   redistribution conductive layers that connect to the chip pads and extend under the surface of the sub molding layer,
   wherein the redistribution conductive layers include:
   a signal redistribution conductive layer that extends toward an edge of the sub molding layer, the signal redistribution conductive layer having a signal redistribution pad on its end portion, and a power redistribution conductive layer that has a length that is shorter than a length of the signal redistribution conductive layer, the power redistribution conductive layer having a power redistribution pad on its end portion;
   a signal sub interconnector having an upper surface that is connected to the signal redistribution pad and a lower surface that is connected to the substrate;
   a power sub interconnector having an upper surface that is connected to the power redistribution pad and a lower surface that is connected to the substrate; and
   at least one main semiconductor chip formed over the sub semiconductor package and electrically connected to the substrate,
   wherein the signal redistribution pad includes a plurality of signal redistribution pads that are disposed at first and second side edges of the sub molding layer in the first direction,
   wherein the chip pads are disposed along first and second side edges of the sub semiconductor chip in a first direction and along third and fourth side edges of the sub semiconductor chip in a second direction, the second direction being perpendicular to the first direction, wherein the signal redistribution conductive layer includes a plurality of signal redistribution conductive layers, wherein the signal redistribution conductive layers, connected to the chip pads that are disposed at the first side edge and the third side edge of the sub semiconductor chip, extend toward the signal redistribution pads that are disposed at the first side edge of the sub molding layer, and wherein the signal redistribution conductive layers, connected to the chip pads that are disposed at the second side edge and the fourth side edge of the sub semiconductor chip, extend toward the signal redistribution pads that are disposed at the second side edge of the sub molding layer.

2. The semiconductor package according to claim 1, wherein a power supply path that passes through the power redistribution conductive layer, the power sub interconnector, and the substrate is shorter than a signal transmission path that passes through the signal redistribution conductive layer, the signal sub interconnector, and the substrate.

3. The semiconductor package according to claim 1, wherein each of the signal sub interconnector and the power sub interconnector includes a solder ball, a metal bump, or a combination thereof.

4. The semiconductor package according to claim 1, wherein:
the signal redistribution conductive layer extends outward from a portion of an edge of the sub semiconductor chip, and
the power redistribution conductive layer extends inward from another portion of the edge of the sub semiconductor chip.

5. The semiconductor package according to claim 1, further comprising:
a main interconnector that connects the main semiconductor chip to the substrate,
wherein the signal sub interconnector includes an internal signal sub interconnector that exchanges a signal between the main semiconductor chip and the sub semiconductor chip,
wherein the main interconnector includes a signal main interconnector that exchanges the signal between the main semiconductor chip and the sub semiconductor chip,
wherein the substrate includes an internal signal sub substrate pad that is connected to the internal signal sub interconnector, and a signal main substrate pad that is connected to the signal main interconnector, and
wherein the internal signal sub substrate pad and the signal main substrate pad are connected to each other by a connection line that is formed in the substrate.

6. The semiconductor package according to claim 1, further comprising:
a main interconnector that connects the main semiconductor chip to the substrate, and
wherein the main interconnector includes a bonding wire.

7. The semiconductor package according to claim 1, wherein the signal redistribution conductive layers have a spiral shape centering on the sub semiconductor chip.

8. The semiconductor package according to claim 1,
wherein the substrate includes substrate pads that are disposed at a first side edge and a second side edge of the substrate in a first direction, and
wherein the main semiconductor chip includes:

at least one first main semiconductor chip connected to the substrate pads that are disposed at the first side edge of the substrate through a first main interconnector; and
at least one second main semiconductor chip connected to the substrate pads that are disposed at the second side edge of the substrate through a second main interconnector.

9. The semiconductor package according to claim 8,
wherein the first main semiconductor chip comprises a plurality of first main semiconductor chips that are offset-stacked in a direction that is away from the first side edge of the substrate in the first direction, and
wherein the second main semiconductor chip comprises a plurality of second main semiconductor chips which are offset-stacked in a direction that is away from the second side edge of the substrate in the first direction.

10. The semiconductor package according to claim 1,
wherein the main semiconductor chip includes memory, and
wherein the sub semiconductor chip includes a memory controller.

11. A semiconductor package comprising:
a substrate;
a sub semiconductor package disposed over the substrate, the sub semiconductor package including:
a sub semiconductor chip having chip pads on its active surface that faces the substrate,
a sub molding layer that surrounds side surfaces of the sub semiconductor chip, the sub molding layer having a surface that faces the substrate, and
a signal redistribution conductive layer and a power redistribution conductive layer that connect to the chip pads and extend under the surface of the sub molding layer to an edge of the sub molding layer;
a signal sub interconnector having an upper surface that is connected to a signal redistribution pad, formed at an end portion of the signal redistribution conductive layer, and a lower surface that is connected to the substrate;
a second power sub interconnector having an upper surface that is connected to a second power redistribution pad, formed at an end portion of the power redistribution conductive layer, and a lower surface that is connected to the substrate;
a first power sub interconnector having an upper surface that is connected to a first power redistribution pad, formed at a portion of the power redistribution conductive layer excluding the end portion of the power redistribution conductive layer, and a lower surface that is connected to the substrate; and
at least one main semiconductor chip formed over the sub semiconductor package and electrically connected to the substrate,
wherein the chip pads are disposed along first and second side edges of the sub semiconductor chip in a first direction and along third and fourth side edges of the sub semiconductor chip in a second direction, the second direction being perpendicular to the first direction,
wherein the signal redistribution conductive layer includes a plurality of signal redistribution conductive layers having a plurality of signal redistribution pads formed at their end portions,
wherein the power redistribution conductive layer includes a plurality of power redistribution conductive layers having a plurality of second power redistribution pads formed at their end portions, wherein the signal redistribution pads and the second power redistribution pads are disposed at first and second side edges of the sub molding layer in the first direction, wherein the signal redistribution conductive layers and the power redistribution conductive layers, connected to the chip pads that are disposed at the first side edge and the third side edge of the sub semiconductor chip, extend toward the signal redistribution pads and the second power redistribution pads that are disposed at the first side edge of the sub molding layer, and wherein the signal redistribution conductive layers and the power redistribution conductive layers, connected to the chip pads that are disposed at the second side edge and the fourth side edge of the sub semiconductor chip, extend toward the signal redistribution pads and the second power redistribution pads that are disposed at the second side edge of the sub molding layer.

12. The semiconductor package according to claim 11, wherein a power supply path that passes through the power redistribution conductive layer, the first power sub interconnector, and the substrate is shorter than a signal transmission path that passes through the signal redistribution conductive layer, the signal sub interconnector, and the substrate.

13. The semiconductor package according to claim 11,
wherein a first power supply path is formed to pass through the power redistribution conductive layer, the first power sub interconnector, and the substrate, and
wherein a second power supply path is formed to pass through the power redistribution conductive layer, the second power sub interconnector, and the substrate.

14. The semiconductor package according to claim 11, wherein each of the signal sub interconnector, the first power sub interconnector, and the second power sub interconnector includes a solder ball, a metal bump, or a combination thereof.

15. The semiconductor package according to claim 11, further comprising:
a main interconnector that connects the main semiconductor chip to the substrate,
wherein the signal sub interconnector includes an internal signal sub interconnector that exchanges a signal between the main semiconductor chip and the sub semiconductor chip,
wherein the main interconnector includes a signal main interconnector that exchanges the signal between the main semiconductor chip and the sub semiconductor chip,
wherein the substrate includes an internal signal sub substrate pad that is connected to the internal signal sub interconnector, and a signal main substrate pad that is connected to the signal main interconnector, and
wherein the internal signal sub substrate pad and the signal main substrate pad are connected to each other by a connection line that is formed in the substrate.

16. The semiconductor package according to claim 11, further comprising:
a main interconnector that connects the main semiconductor chip to the substrate, and
wherein the main interconnector includes a bonding wire.

17. The semiconductor package according to claim 11, wherein the signal redistribution conductive layers and the power redistribution conductive layers have a spiral shape centering on the sub semiconductor chip.

18. The semiconductor package according to claim 17,
wherein the main semiconductor chip includes memory, and
wherein the sub semiconductor chip includes a memory controller.

19. The semiconductor package according to claim 11,
wherein the substrate includes substrate pads disposed at a first side edge and a second side edge of the substrate in a first direction, and
wherein the main semiconductor chip includes:
at least one first main semiconductor chip connected to the substrate pads that are disposed at the first side edge of the substrate through a first main interconnector; and
at least one second main semiconductor chip connected to the substrate pads that are disposed at the second side edge of the substrate through a second main interconnector.

20. The semiconductor package according to claim 19,
wherein the first main semiconductor chip comprises a plurality of first main semiconductor chips that are offset-stacked in a direction that is away from the first side edge of the substrate in the first direction, and
wherein the second main semiconductor chip comprises a plurality of second main semiconductor chips which are offset-stacked in a direction that is away from the second side edge of the substrate in the first direction.

21. The semiconductor package according to claim 11, wherein the power redistribution conductive layer is interposed between two signal redistribution conductive layers.

* * * * *